United States Patent
Shimizu et al.

(10) Patent No.: US 11,094,899 B2
(45) Date of Patent: Aug. 17, 2021

(54) METHOD FOR MANUFACTURING FIELD EFFECT TRANSISTOR AND METHOD FOR MANUFACTURING WIRELESS COMMUNICATION DEVICE

(71) Applicant: Toray Industries, Inc., Tokyo (JP)

(72) Inventors: Hiroji Shimizu, Otsu (JP); Seiichiro Murase, Otsu (JP); Shota Kawai, Otsu (JP)

(73) Assignee: Toray Industries, Inc.

( * ) Notice: Subject to any disclaimer, the term of this patent is extended or adjusted under 35 U.S.C. 154(b) by 0 days.

(21) Appl. No.: 16/331,006

(22) PCT Filed: Sep. 6, 2017

(86) PCT No.: PCT/JP2017/032066
§ 371 (c)(1),
(2) Date: Mar. 6, 2019

(87) PCT Pub. No.: WO2018/051860
PCT Pub. Date: Mar. 22, 2018

(65) Prior Publication Data
US 2019/0198786 A1    Jun. 27, 2019

(30) Foreign Application Priority Data
Sep. 16, 2016    (JP) .............................. JP2016-181246

(51) Int. Cl.
*H01L 51/40* (2006.01)
*H01L 51/05* (2006.01)
(Continued)

(52) U.S. Cl.
CPC .... *H01L 51/0558* (2013.01); *G06K 19/07724* (2013.01); *G06K 19/07773* (2013.01);
(Continued)

(58) Field of Classification Search
CPC ... H01L 23/66; H01L 29/786; H01L 51/0003; H01L 51/0018; H01L 51/0048;
(Continued)

(56) References Cited

U.S. PATENT DOCUMENTS 8,350,255 B2    1/2013    Nomoto et al.
8,530,889 B2    9/2013    Jo et al.
(Continued)

FOREIGN PATENT DOCUMENTS

JP    2006265534 A    10/2006
JP    2007129007 A    5/2007
(Continued)

OTHER PUBLICATIONS

International Search Report and Written Opinion for International Application No. PCT/JP2017/032066, dated Oct. 31, 2017—8 pages.
(Continued)

*Primary Examiner* — Brook Kebede
(74) *Attorney, Agent, or Firm* — RatnerPrestia

(57) ABSTRACT

Provided is a method for manufacturing a field-effect transistor, the method including the steps of: forming a gate electrode on the surface of a substrate; forming a gate insulating layer on the gate electrode; forming a conductive film containing a conductor and a photosensitive organic component by a coating method on the gate insulating layer; exposing the conductive film from the rear surface side of the substrate with the gate electrode as a mask; developing the exposed conductive film to form a source electrode and a drain electrode; and forming a semiconductor layer by a
(Continued)

coating method between the source electrode and the drain electrode. This method makes it possible to provide an FET, a semiconductor device, and an RFID which can be prepared by a simple process, and which have a high mobility, and have a gate electrode and source/drain electrodes aligned with a high degree of accuracy.

17 Claims, 5 Drawing Sheets

(51) Int. Cl.
| | | |
|---|---|---|
| *H01L 29/786* | (2006.01) | |
| *G06K 19/077* | (2006.01) | |
| *H01L 23/66* | (2006.01) | |
| *H01L 51/00* | (2006.01) | |

(52) U.S. Cl.
CPC ............ *H01L 23/66* (2013.01); *H01L 29/786* (2013.01); *H01L 51/0003* (2013.01); *H01L 51/0018* (2013.01); *H01L 51/0048* (2013.01); *H01L 51/0097* (2013.01); *H01L 51/05* (2013.01); *H01L 51/052* (2013.01); *H01L 51/0541* (2013.01); *H01L 51/0545* (2013.01); *H01L 2223/6677* (2013.01)

(58) Field of Classification Search
CPC ............ H01L 51/0097; H01L 51/052; H01L 51/0541; H01L 51/0545; H01L 51/0558; G06K 19/07724; G06K 19/07773
USPC ............................................ 438/99, 149–166
See application file for complete search history.

(56) References Cited

U.S. PATENT DOCUMENTS

| | | | |
|---|---|---|---|
| 2007/0178616 A1 | 8/2007 | Arai et al. | |
| 2008/0048181 A1* | 2/2008 | Tanaka | ................. C07D 333/18 |
| | | | 257/40 |
| 2009/0047597 A1* | 2/2009 | Felder | ..................... B41M 5/42 |
| | | | 430/201 |
| 2010/0176379 A1* | 7/2010 | Kim | .................... H01L 51/0021 |
| | | | 257/40 |
| 2011/0068417 A1 | 3/2011 | Murase et al. | |
| 2011/0101312 A1* | 5/2011 | LeCloux | ............ H01L 51/0072 |
| | | | 257/40 |
| 2013/0248849 A1* | 9/2013 | Feldman | ................ H05B 33/14 |
| | | | 257/40 |

FOREIGN PATENT DOCUMENTS

| | | |
|---|---|---|
| JP | 2009283862 A | 12/2009 |
| JP | 2010532559 A | 10/2010 |
| JP | 2010251574 A | 11/2010 |
| JP | 2011119529 A | 6/2011 |
| JP | 2011187995 A | 9/2011 |
| JP | 2014048619 A | 3/2014 |
| KR | 20080062263 A * | 7/2008 |
| WO | 2009116373 A1 | 9/2009 |
| WO | 2009139339 A1 | 11/2009 |
| WO | 2012018082 A1 | 2/2012 |
| WO | 2012132487 A1 | 10/2012 |

OTHER PUBLICATIONS

Indian Examination Report for Indian Application No. 201947014669, dated Mar. 15, 2021, with translation, 5 pages.

* cited by examiner (a)

(b)

METHOD FOR MANUFACTURING FIELD EFFECT TRANSISTOR AND METHOD FOR MANUFACTURING WIRELESS COMMUNICATION DEVICE

CROSS REFERENCE TO RELATED APPLICATIONS

This is the U.S. National Phase application of PCT/JP2017/032066, filed Sep. 6, 2017, which claims priority to Japanese Patent Application No. 2016-181246, filed Sep. 16, 2016, the disclosures of these applications being incorporated herein by reference in their entireties for all purposes.

FIELD OF THE INVENTION

The present invention relates to a method for manufacturing a field-effect transistor and a method for manufacturing a wireless communication device.

BACKGROUND OF THE INVENTION

In recent years, the development of techniques for constituting field-effect transistors (hereinafter referred to as FETs) with the use of semiconductor layers formed on insulating substrates has been advanced. The FETs are widely applied to electronic devices such as ICs and switching elements of image display devices. In particular, in recent years, wireless communication systems that use an RFID (Radio Frequency IDentification) technology have been attracting attention as non-contact tags including circuits composed of FETs.

An RFID tag has an IC chip including a circuit composed of FETs and an antenna for wireless communications with a reader/writer, and the antenna installed in the tag receives carrier waves transmitted from the reader/writer, thereby operating the drive circuit in the IC chip.

RFID tags are expected to be used in various applications such as logistics management, product management, and shoplifting prevention, and the introduction of the tags has been started for IC cards such as transport cards, product tags, and the like.

From now on, in order to use RFID tags for all products, it is necessary to reduce the manufacturing costs. Therefore, flexible and inexpensive processes that use coating/printing technology have been studied, which have broken away from manufacturing processes that use vacuum or high temperatures.

For example, FETs that use, as semiconductor layers, an organic semiconductor or a carbon nanotube which has excellent moldability have been proposed for circuits in IC chips. The use of the organic semiconductor or carbon nanotube as an ink makes it possible to form circuit patterns directly on flexible substrates by an ink-jet technique, screening technique, or the like. Therefore, instead of conventional inorganic semiconductors, FETs that use an organic semiconductors or a carbon nanotube have been studied actively (see, for example, Patent Literature 1).

For an FET constituting a circuit in an RFID, high-accuracy alignment is required, because misalignment between the gate electrode and the source/drain electrodes causes a decrease in operation speed and a deterioration in FET performance. Furthermore, from the viewpoint of productivity, the amount of alignment time is also required to be shortened. Therefore, a method of forming source/drain electrodes by rear surface exposure and processing for development from the rear surface side of a substrate with a gate electrode as a light-shielding mask has been studied (see, for example, Patent Literatures 2 to 3).

PATENT LITERATURE

[PTL 1] International Publication No. 2009/139339
[PTL 2] Japanese Unexamined Patent Publication No. 2011-187995
[PTL 3] Japanese Unexamined Patent Publication No. 2010-251574

SUMMARY OF THE INVENTION

According to Patent Literature 2, a gate electrode is formed on a substrate with an insulating surface, a gate insulating layer that covers the gate electrode is formed, a semiconductor layer is formed on the gate insulating layer by a plasma CVD method or a sputtering method, a negative-type photosensitive conductive film pattern is formed on the semiconductor layer, and source and drain electrodes are formed by laser exposure and development from the rear surface side of the substrate with the gate electrode as a mask. However, since the semiconductor layer is formed by a vacuum process, it is difficult to reduce the manufacturing cost. In addition, since after the formation of the semiconductor layer, the conductive film pattern is formed directly on the semiconductor layer and subjected to treatment for exposure/development, there is a problem that the mobility of the FET is deteriorated due to damage to the semiconductor layer.

According to Patent Literature 3, a gate electrode formed by patterning on a substrate is covered with a gate insulating layer, an organic semiconductor layer and an electrode film are formed on the gate insulating layer, a resist film is formed on the semiconductor layer and the electrode film, and with the gate electrode as a light-shielding mask, subjected to treatment for exposure and develop from the rear surface side of the substrate, and the electrode film is etched to form a source/drain. However, it is necessary to newly add the step of forming the resist film and applying the patterning to the resist film, and it is difficult to reduce the manufacturing cost. Furthermore, since the semiconductor layer, the electrode, and the gate insulating layer are damaged while the resist and the electrode film are exposed, developed, and etched, there are the problems: the deteriorated mobility of the FET; and the defective adhesion between the insulating layer and the electrode film.

In view of the problems mentioned above, an object of the present invention is to prepare an FET by a simple process, where the FET has a high mobility, and has a gate electrode and source/drain electrodes aligned with a high degree of accuracy.

In order to solve the problems mentioned above, the present invention includes the following manufacturing method. More specifically, the present invention provides a method for manufacturing a field-effect transistor, the method including the steps of: forming a gate electrode on the surface of a substrate; forming a gate insulating layer on the gate electrode; forming a conductive film containing a conductor and a photosensitive organic component by a coating method on the gate insulating layer; exposing the conductive film from the rear surface side of the substrate with the gate electrode as a mask; developing the exposed conductive film to form a source electrode and a drain electrode; and forming a semiconductor layer by a coating method between the source electrode and the drain electrode.

In addition, the present invention also provides a method for manufacturing a field-effect transistor, the method including the steps of: forming a source electrode and a drain electrode on the surface of a substrate; forming a semiconductor layer by a coating method between the source electrode and the drain electrode; forming a gate insulating layer on the source electrode, the drain electrode, and the semiconductor layer; forming a conductive film containing a conductor and a photosensitive organic component by a coating method on the gate insulating layer; exposing the conductive film from the rear surface side of the substrate with the source electrode and the drain electrode as a mask; and developing the exposed conductive film to form a gate electrode.

According to the present invention, it is possible to prepare an FET which has a gate electrode and source/drain electrodes aligned with high accuracy without any damage to a semiconductor layer. In addition, the amount of alignment time for the electrode patterning step can be also shortened, thereby also allowing a further reduction in manufacturing cost.

DETAILED DESCRIPTION OF EMBODIMENTS OF THE INVENTION

Hereinafter, a method for manufacturing a field-effect transistor according to an embodiment of the present invention will be described in detail. It is to be noted that the present invention is not to be considered limited by the following embodiment, and obviously, various modifications can be made without departing from the scope of the invention as long as the object of the invention can be achieved.

(Method for Manufacturing Field-Effect Transistor)

A first example of a method for manufacturing a field-effect transistor (FET) according to an embodiment of the present invention includes the following steps (a) to (f):

(a) step of forming a gate electrode on a surface of a substrate;

(b) step of forming a gate insulating layer on the gate electrode;

(c) step of forming a conductive film containing a conductor and a photosensitive organic component on the gate insulating layer by a coating method;

(d) step of exposing the conductive film from the back side of the substrate with the gate electrode as a mask;

(e) step of developing the exposed conductive film to form a source electrode and a drain electrode; and (f) step of forming a semiconductor layer between the source electrode and the drain electrode by a coating method.

Figure 1:
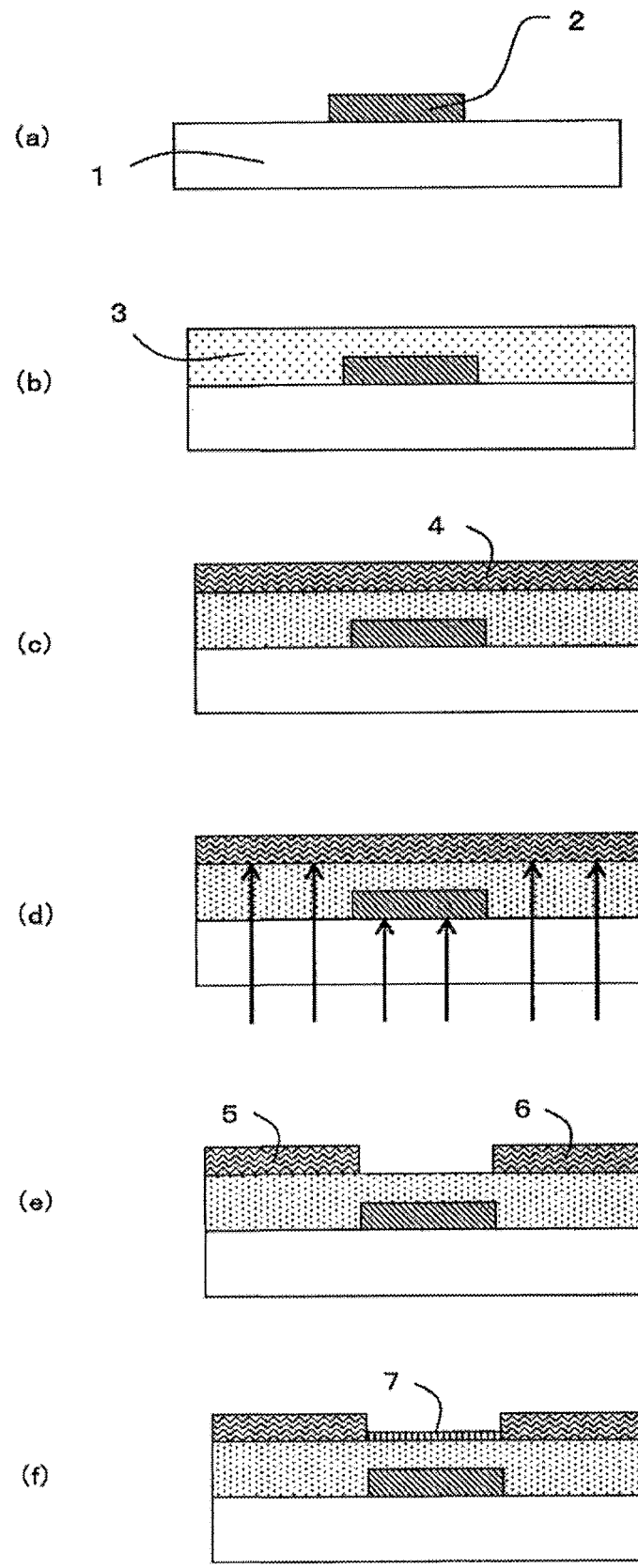
FIG. 1 is a schematic cross-sectional view illustrating a first example of a method for manufacturing a field-effect transistor according to an embodiment of the present invention.

FIG. 1 is a schematic cross-sectional view illustrating a first example of a method for manufacturing an FET according to an embodiment of the present invention. In accordance with FIG. 1, (a) a gate electrode 2 is formed on the surface of a substrate 1, (b) a gate insulating layer 3 is formed so as to cover the gate electrode 2, (c) a conductive film 4 containing a conductor and a photosensitive organic component is formed by a coating method on the gate insulating layer 3, (d) the conductive film 4 is exposed from the rear surface side of the substrate 1 with the gate electrode 2 as a mask, (e) the exposed conductive film 4 is developed to form a source electrode 5 and a drain electrode 6, and (f) a semiconductor layer 7 is formed by a coating method between the source electrode 5 and the drain electrode 6.

This method makes it possible to prepare an FET which has a gate electrode and source/drain electrodes aligned with a high degree of accuracy in a short period of alignment time. Furthermore, since the semiconductor layer is formed after the source electrode and the drain electrode are subjected to patterning, the semiconductor layer is not affected by the process for exposure/development when the source electrode and the drain electrode are subjected to patterning, and performance deterioration of the FET due to the patterning can be suppressed.

Although not described in FIG. 1, it may further include the step of forming the wiring for the gate electrode, the wiring for the source electrode and the drain electrode.

Figure 3:
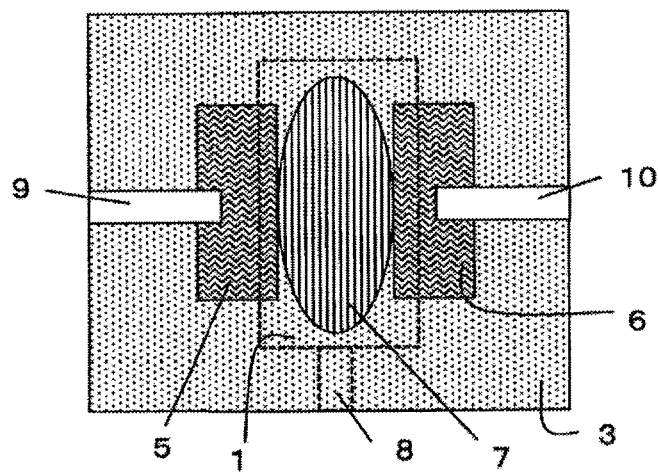
FIG. 3 is a schematic plan view of a field-effect transistor formed by a method for manufacturing a field-effect transistor according to an embodiment of the present invention.

FIG. 3 shows an example in which wirings are formed for the FET obtained according to the first embodiment of the present invention. It is preferable to form the wiring 8 for the gate electrode 2 at the same time as the gate electrode 2 from the viewpoint of reducing the number of manufacturing steps. In addition, it is preferable to form the wirings 9 and 10 for the source electrode 5 and the drain electrode 6 at the same time as the formation of the conductive film 4 by a coating method from the viewpoint of reducing the number of manufacturing steps.

A second example of the method for manufacturing an FET according to the embodiment of the present invention includes the following steps (A) to (F):

(A) step of forming a source electrode and a drain electrode on a surface of a substrate;

(B) step of forming a semiconductor layer by a coating method between the source electrode and the drain electrode;

(C) step of forming a gate insulating layer on the source electrode, the drain electrode, and the semiconductor layer;

(D) step of forming a conductive film containing a conductor and a photosensitive organic component by a coating method on the gate insulating layer;

(E) step of exposing the conductive film from the back side of the substrate with the source electrode and the drain electrode as a mask; and (F) step of developing the exposed conductive film to form a gate electrode.

Figure 2:
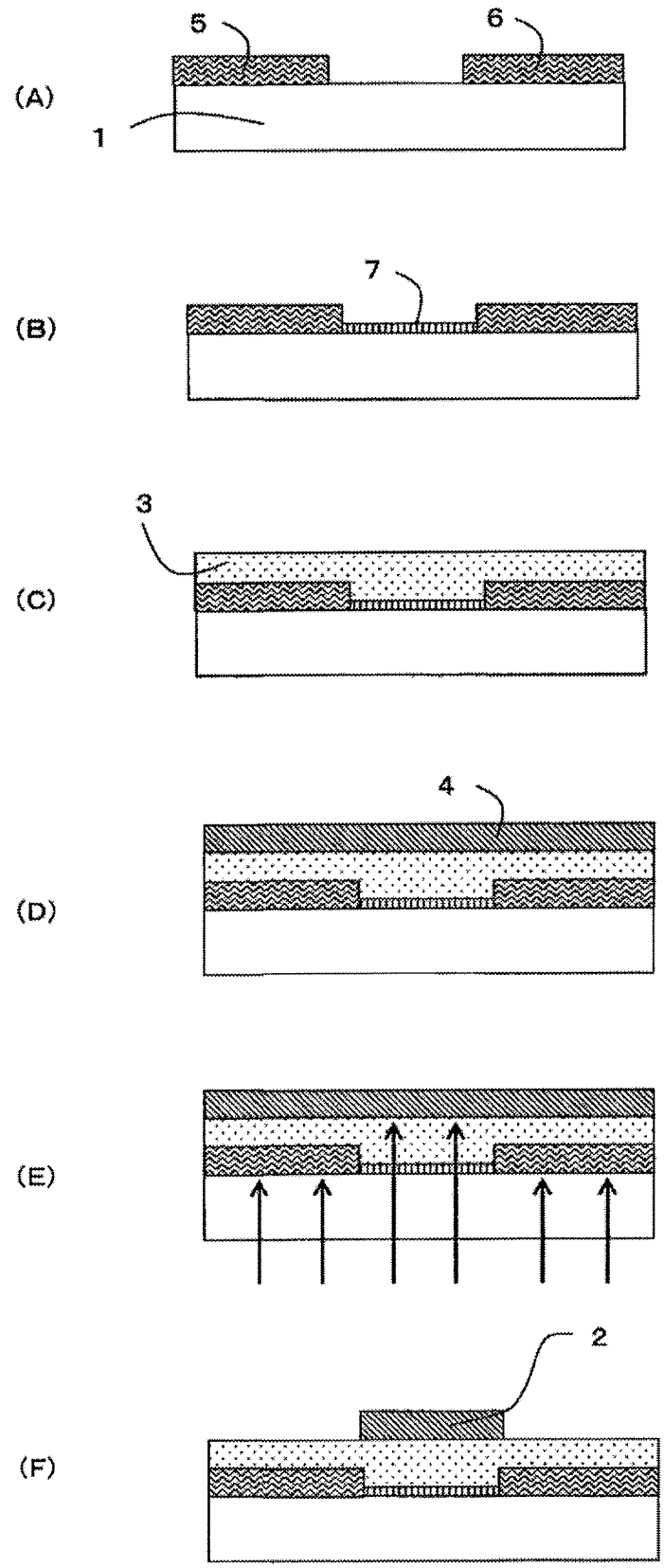
FIG. 2 is a schematic cross-sectional view illustrating a second example of a method for manufacturing a field-effect transistor according to an embodiment of the present invention.

FIG. 2 is a schematic cross-sectional view illustrating the second example of the method for manufacturing an FET according to the embodiment of the present invention. In FIG. 2, (A) a source electrode 5 and a drain electrode 6 are formed on the surface of the substrate 1, (B) a semiconductor layer 7 is formed by a coating method between the source electrode 5 and the drain electrode 6, (C) a gate insulating layer 3 is formed on the source electrode 5, the drain electrode 6, and the semiconductor layer 7, (D) a conductive film 4 containing a conductor and a photosensitive organic component is formed by a coating method on the gate insulating layer 3, (E) the conductive film 4 is exposed from the rear surface side of the substrate 1 with the source electrode 5 and the drain electrode 6 as a mask, and (F) the exposed conductive film 4 is developed to form a gate electrode 2.

This method makes it possible to prepare an FET which has source/drain electrodes and a gate electrode aligned with a high degree of accuracy in a short period of alignment time. Furthermore, since the semiconductor layer is formed after the source electrode and the drain electrode are subjected to patterning, the semiconductor layer is not affected by the process when the source electrode and the drain electrode are subjected to patterning, and performance deterioration of the FET due to the patterning can be suppressed.

Although not illustrated in FIG. 2, the method may further include the step of forming a wiring for the gate electrode, and wirings for the source electrode and the drain electrode.

In the present invention, forming a certain layer or film by a coating method means that the layer or film is formed by a method including a step of applying a liquid material or a paste-like material which is a raw material for the layer or film.

Examples of the method for forming the electrodes in steps (a) and (A) include an inkjet method, a printing method, and an ion plating coating method, and also include a resistance heating evaporation method, an electron beam method, a sputtering method, a plating method, and a CVD method. Above all, from the viewpoints of manufacturing cost, material use efficiency, compatibility with large areas, etc., it is preferable to use a coating method. In addition, the examples also include, in a case in which a paste containing a binder and a conductor is used as an electrode material, a method of applying the paste through the use of a known technique such as a spin coating method, a blade coating method, a slit die coating method, a screen printing method, a bar coater method, a casting method, a transfer printing method, and an immersion and withdrawal method, and drying the paste with the use of an oven, a hot plate, infrared rays, or the like. In addition, as a method for forming the electrode pattern, the electrode thin film prepared by the method mentioned above may be subjected to patterning into a desired shape by a known photolithography method or the like, or subjected to patterning through a mask in a desired shape at the time of vapor deposition or sputtering of an electrode material.

The method for preparing the gate insulating layer in the steps (b) and (C) is not particularly limited, but examples of the method include a method in which a coating film obtained by applying a raw material composition onto the substrate with the lower electrode formed thereon and drying the composition is subjected to a heat treatment, if necessary. Examples of the coating method include known coating methods such as a spin coating method, a blade coating method, a slit die coating method, a screen printing method, a bar coater method, a casting method, a transfer printing method, an immersion and withdrawal method, and an ink-jet method. The temperature of the heat treatment for the coating film preferably falls within the range of 100 to 300° C.

Here is an example of steps (c), (d), (e), (D), (E), and (F). The photosensitive paste mentioned above is entirely or partially applied onto the substrate on which the lower electrode and the gate insulating layer are formed. Examples of the coating method include a spin coating method that uses a spinner, a spray coating method, a roll coating method, a screen printing method, a blade coater method, a die coater method, a calendar coater method, a meniscus coater method, a bar coater method, a gravure printing method, a flexographic printing method, an offset printing method, an immersion and withdrawal method, an ink-jet method, and a dispenser method. Further, the thickness of the coating film varies depending on the coating method, the solid content concentration of the composition, viscosity, and the like, and an adjustment is thus made so that the dried film thickness has a predetermined value.

Next, the solvent is removed from the coating film applied on the substrate. Thus, the conductive film 4 is formed. Examples of the method for removing the solvent include drying by heating with an oven, a hot plate, infrared rays, or the like, and vacuum drying. The drying by heating is preferably carried out in the range from 50° C. to 180° C. for 1 minute to several hours.

Next, the conductive film after the removal of the solvent is subjected to patterning by photolithography. As a light source that is used for exposure, it is preferable to use i-line (365 nm), h line (405 nm), or g line (436 nm) of a mercury lamp. Furthermore, the intensity $I_0$ of the light (exposure light) used for exposure and the intensity I of light passing through the substrate, and the electrode and gate insulating layer formed on the substrate surface preferably satisfy the following formula (a):

$$-\text{LOG}_{10}(I/I_0) \geq 2 \tag{a}$$

In a case in which the formula (a) is satisfied, the conductive film 4 is exposed to sufficiently intense light, thereby promoting light curing of the conductive film 4, and improving the processing accuracy. It is to be noted that the left-hand side of the formula (a) represents an absorbance, and the absorbance can be measured with a spectrophotometer.

The exposure is performed by making light incident from the rear surface side of the substrate. The upper electrode is subjected to patterning with the lower electrode as a mask by the foregoing exposure from the rear surface, thus making it possible to align the lower electrode and the upper electrode with a high degree of accuracy without any alignment.

After the exposure, a step of exposing the conductive film 4 to light from the surface side of the substrate may be added before development. For the exposure in this case, the previously described exposure light source can be used. The addition of this step promotes light curing on the surface side of the conductive film 4, thereby making it possible to reduce the film reduction of the conductive film 4 due to a development step or the like as described later, and thus reducing the surface roughness of the conductive film 4. The small surface roughness of the conductive film improves the coating property of the semiconductor layer described later, thereby making it possible to form a uniform semiconductor layer, and thus improving the characteristics of the FET prepared. It is to be noted that the surface roughness of the conductive film can be measured by a contact-type surface roughness measurement, an atomic force microscope, an ellipsometric method, or the like.

Next, a desired upper electrode pattern can be obtained by removing the unexposed part with the use of a developer.

Aqueous solutions of compounds such as tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, and hexamethylenediamine are preferred as the developer in the case of alkali development. In some cases, as the developer, the foregoing aqueous solutions may be used to which polar solvents such as N-methyl-2-pyrrolidone, N,N-dimethylformamide, N,N-dimethylacetamide, dimethylsulfoxide, and γ-butyrolactone; alcohols such as methanol, ethanol, and isopropanol; esters such as ethyl lactate and propylene glycol monomethyl ether acetate; and ketones such as cyclopentanone, cyclohexanone, isobutyl ketone, and methyl isobutyl ketone; and the like are added alone or in combination. In addition, these alkali aqueous solutions with a surfactant added thereto can be also used as the developer.

As the developer in the case of organic development, polar solvents such as N-methyl-2-pyrrolidone, N-acetyl-2-pyrrolidone, N,N-dimethylacetamide, N,N-dimethylformamide, dimethyl sulfoxide, and hexamethylphosphoric triamide can be used alone, or as a mixed solution, in combination with methanol, ethanol, isopropyl alcohol, xylene, water, methyl carbitol, ethyl carbitol, or the like.

The development can be carried out by a method such as spraying the above-mentioned developer onto the film surface to be coated, while leaving the substrate stationary or rotating the substrate, immersing the substrate in the developer, or applying ultrasonic waves while immersing the substrate.

After the development, a rinsing treatment with water may be applied. Again, alcohols such as ethanol and isopropyl alcohol, esters such as ethyl lactate, propylene glycol monomethyl ether acetate, and the like may be added to the water for the rinsing treatment.

Next, the upper electrode is subjected to curing in order to exhibit conductivity. Examples of the curing method include heat curing by heating with an oven, inert oven, a hot plate, infrared ray, or the like, vacuum curing, and curing with a xenon flash lamp. In the case of curing by heating, the curing temperature preferably falls within the range of 100° C. or higher and 300° C. or lower, more preferably 100° C. or higher and 200° C. or lower, and still more preferably 120° C.° C. or higher and 180° C. or lower. The heating temperature of 120° C. or higher can increase the volumetric shrinkage amount of the photosensitive organic component of the resin, thereby making the specific resistivity lower.

It is to be noted that the photosensitive paste used in the present invention preferably achieves high conductivity through curing at a relatively low temperature of 180° C. or lower. In that case, the photosensitive paste can be used on a substrate with low heat resistance or in combination with a material with low heat resistance.

As a method for forming the semiconductor layer in the steps (f) and (B), it is also possible to use dry methods such as resistance heating evaporation, electron beams, sputtering, and CVD, but from the viewpoint of manufacturing cost and adaptability to large areas, it is preferable to use a coating method. The same method as described for the composition mentioned previously can be used as the coating method, and examples of the coating method include known coating methods such as a spin coating method, a blade coating method, a slit die coating method, a screen printing method, a bar coating method, a casting method, a transfer printing method, an immersion and withdrawal method, and an ink-jet method. Above all, the coating method is preferably any one selected from the group consisting of an ink-jet method, a dispenser method, and a spray method. Furthermore, from the viewpoint of the raw material use efficiency, the ink-jet method is more preferred. From among the foregoing coating methods, an appropriate method can be selected depending on coating film characteristics to be achieved, such as coating film thickness control and orientation control. In addition, the formed coating film may be subjected to an annealing treatment under the atmosphere, under reduced pressure, or under an inert gas atmosphere (under a nitrogen or argon atmosphere).

Next, members constituting the FET will be described in detail. Unless otherwise noted, the members are common to all embodiments. It is to be noted that in the following description, the electrode formed on the surface of the substrate is referred to as a lower electrode, and the electrode formed on the gate insulating layer is referred to as an upper electrode. More specifically, according to a first embodiment, the gate electrode corresponds to the lower electrode, the source electrode and the drain electrode correspond to the upper electrode, and according to a second embodiment, the source electrode and the drain electrode correspond to the lower electrode, and the gate electrode corresponds to the upper electrode.

<Substrate>

The material used for the substrate is not particularly limited, but preferably a material that has at least an insulating surface on which the electrodes are disposed. In addition, the material is made of a material that transmits 50% or more, further preferably 80% or more of light used for the exposure.

For example, base materials are preferably used which include, but not limited to:
inorganic materials such as glass, sapphire, alumina sintered bodies, and silicon wafers, and materials with surfaces thereof coated with an oxide film;
resins such as a polyimide (PI) resin, a polyester resin, a polyamide resin, an epoxy resin, a polyamideimide resin, a polyetherimide resin, a polyetherketone resin, a polysulfone resin, a polyphenylene sulfide (PPS) resin, and a cycloolefin resin.

Among the materials, it is preferable to include at least one resin selected from polyethylene terephthalate (PET), polyethylene naphthalate, PPS, polyphenylene sulfone, a cycloolefin polymer, polyamide, or PI, and from the viewpoint of low price, a PET film is preferred.

From the viewpoint of adhesion between the substrate and the lower electrode or wiring, a polysulfone resin substrate or a PPS resin substrate is also preferred. This is presumed to be because the metal atoms in the lower electrode and the wiring strongly interact with the sulfur atoms included in the foregoing resins.

In addition, the thickness of the substrate is preferably 200 μm or less. Within this range, scattering of the exposure light in the substrate is suppressed during processing of the conductive film by exposure from the rear surface of the substrate, and the processing accuracy of the conductive film is further improved.

<Lower Electrode>

The lower electrode may be any electrode may as long as the electrode includes a conductor that can be used as an electrode, but the lower electrode preferably has a light shielding property. The light shielding property herein means that the transmittance at the wavelength of light used for exposing the conductive film is 10% or lower, and the transmittance is preferably 1% or lower, more preferably 0.1% or lower.

Above all, the lower electrode preferably contains a conductor and a binder, from the viewpoint of the increased flexibility of the electrode, leading to good adhesion, and then favorable electrical connection even at the time of bending.

Specific examples of the conductor include, but not limited to, conductive metal oxides such as tin oxide, indium oxide, indium tin oxide (ITO), and ruthenium oxide; metals such as platinum, gold, silver, copper, iron, tin, zinc, aluminum, indium, chromium, lithium, sodium, potassium, cesium, calcium, magnesium, palladium, molybdenum, tungsten, amorphous silicon, and polysilicon, and alloy thereof; inorganic conductive compounds such as copper iodide and copper sulfide;

conductive polymers such as polythiophene, polypyrrole, polyaniline, a complex of polyethylenedioxythiophene and polystyrene sulfonic acid; and carbon materials such as carbon, and materials containing an organic component and a conductor. The conductivity of the conductive polymer is preferably improved by doping with iodine or the like.

These electrode materials may be used alone, or two or more thereof may be laminated or used in mixture.

The conductor is preferably composed of gold, silver, copper, or platinum particles from the viewpoint of conductivity. Among the particles, the silver particles are more preferred from the viewpoints of cost and stability. In addition, from the viewpoint of reducing the resistivity at the time of low-temperature curing of the coating film, it is more preferable to contain carbon black in addition to the particles mentioned above. The average particle size of the particles is preferably 0.02 µm or more and 10 µm or less, more preferably 0.02 µm or more and 5 µm or less, and still more preferably 0.02 µm or more and 2 µm or less. When the average particle size is 0.02 µm or more, the contact probability between the particles is improved, thereby making it possible to reduce the specific resistance value and disconnection probability of the electrode to be prepared. In addition, when the average particle size is 10 µm or less, the surface smoothness, pattern accuracy, and dimensional accuracy of the electrode are improved.

It is to be noted that the average particle size is calculated by observing a cross section of the lower electrode at 10000-fold magnification with the use of a scanning electron microscope (SEM), measuring lengths of the particle sizes of 100 particles randomly selected from the obtained image, and averaging up the lengths. In a case in which the shape of the particle is spherical, the diameter is regarded as the particle size. In a case in which the shape is other than spherical, the average value for the maximum width and minimum width observed for one particle is regarded as the particle size of the particle.

The content of the conductor in the electrode preferably falls within the range of 70% by mass or higher and 95% by mass or lower of the electrode. The lower limit of the content is preferably 80% by mass or more. The upper limit of the content is preferably 90% by mass or less. The content of the conductor within this range can decrease the specific resistance value and disconnection probability of the electrode.

The binder is not particularly limited, but preferably contains a component selected from a monomer, an oligomer, a polymer, a photopolymerization initiator, a plasticizer, a leveling agent, a surfactant, a silane coupling agent, a defoaming agent, a pigment, and the like. From the viewpoint of improving the bending resistance of the electrode, it is preferable to contain at least an oligomer or a polymer.

The oligomer or the polymer is not particularly limited, but an acrylic resin, an epoxy resin, a novolac resin, a phenol resin, a polyimide precursor, a polyimide, or the like can be preferably used. From the viewpoint of crack resistance in the case of bending, an acrylic resin is preferred. This is presumed to be because the acrylic resin has a glass transition temperature of 100° C. or lower, and softens when the electrode is thermally cured, thereby increasing the inter-conductor binding.

The acrylic resin is a resin including at least a structure derived from an acrylic monomer as a repeating unit. Specific examples of the acrylic monomer preferably include, but not particularly limited thereto, acrylic monomers such as methyl acrylate, acrylic acid, 2-ethylhexyl acrylate, ethyl methacrylate, n-butyl acrylate, i-butyl acrylate, i-propane acrylate, glycidyl acrylate, N-methoxymethylacrylamide, N-ethoxymethylacrylamide, N-n-butoxymethylacrylamide, N-isobutoxymethylacrylamide, butoxytriethylene glycol acrylate, dicyclopentanyl acrylate, dicyclopentenyl acrylate, 2-hydroxyethyl acrylate, isobornyl acrylate, 2-hydroxypropyl acrylate, isodecyl acrylate, isooctyl acrylate, lauryl acrylate, 2-methoxyethyl acrylate, methoxy ethylene glycol acrylate, methoxy diethylene glycol acrylate, octafluoropentyl acrylate, phenoxyethyl acrylate, stearyl acrylate, trifluoroethyl acrylate, acrylamide, aminoethyl acrylate, phenyl acrylate, phenoxyethyl acrylate, 1-naphthyl acrylate, 2-naphthyl acrylate, thiophenol acrylate, and benzyl mercaptan acrylate, and those with acrylates thereof replaced with methacrylate. These acrylic monomers may be used alone, or two or more thereof may be used. Also, other monomers may be copolymerized, e.g., styrenes such as styrene, p-methylstyrene, o-methylstyrene, m-methylstyrene, α-methylstyrene, chloromethylstyrene, and hydroxymethylstyrene; γ-methacryloxypropyltrimethoxysilane, and 1-vinyl-2-pyrrolidone.

The lower electrode has arbitrary width and thickness. From the viewpoint of ease of forming an electrode pattern, the electrode width is preferably, but not limited to, 10 µm or more and 10 mm or less, and the thickness is preferably, but not limited to, 0.01 µm or more and 100 µm or less.

The wiring material for the lower electrode may be any wiring material as long as the material includes a conductor that can be commonly used, as with the lower electrode. The method for forming the wiring is the same as the method for forming the electrode. The lower electrode and the wiring have only to be at least partially electrically connected. The connection between the lower electrode and the wiring has arbitrary width and thickness.

The lower electrode and the wiring material are preferably made of the same material. This is because with the reduced number of materials, the lower electrode and the wiring are prepared in the same step, thereby allowing the number of manufacturing steps and the cost to be reduced.

The fact that the lower electrode and the wiring are made of the same material means that the same element has the highest molar content ratio among the elements included in the lower electrode and the wiring. The types and content ratios of the elements in the electrode can be identified by elemental analysis such as X-ray photoelectron spectroscopy (XPS) and secondary ion mass spectrometry (SIMS).

When the lower electrode and the wiring are fabricated in the same step, the connecting portion between the lower electrode and the wiring is formed in a continuous phase. From the viewpoint of adhesion between the lower electrode and the wiring and reduction in the manufacturing cost, it is preferable to form these in a continuous phase. The fact that the lower electrode and the wiring pattern are continuous phases means that these patterns are integrated, and no connection interface exists at the connection portion. It can be confirmed by observing the cross section of the connecting portion with a scanning electron microscope (SEM), a transmission electron microscope (TEM) or the like that the connecting portion between the lower electrode and the wiring is a continuous phase.

<Gate Insulating Layer>

The material used for the gate insulating layer is not particularly limited, but examples of the material can include inorganic materials such as silicon oxide and alumina; organic polymer materials such as polyimide, polyvinyl alcohol, polyvinyl chloride, polyethylene terephthalate, polyvinylidene fluoride, polysiloxane, and polyvinyl phenol (PVP); or a mixture of an inorganic material powder and an organic material. Above all, the material preferably contains an organic compound including a bond between a silicon atom and a carbon atom. In addition, the material also preferably contains an organic compound including a bond between a silicon atom and a carbon atom, and a metal compound including a bond between a metal atom and an oxygen atom.

Examples of the organic compound including a bond between a silicon atom and a carbon atom include a silane compound represented by the following general formula (1), an epoxy group-containing silane compound represented by the following general formula (2), a silane compound represented by the following general formula (3), or a condensate thereof, or a polysiloxane containing the compound as a polymerized component. Among these examples, the polysiloxane is more preferred, because the polysiloxane is high in insulating property and capable of being cured at low temperature. The gate insulating layer may contain one or more polysiloxanes.

  (1)

In the formula, $R^1$ represents a hydrogen atom, an alkyl group, a heterocyclic group, an aryl group, or an alkenyl group. In a case in which there is more than one $R^1$, each $R^1$ may be identical or different. $R^2$ represents a hydrogen atom, an alkyl group, an acyl group, or an aryl group. In a case in which there is more than one $R^2$, each $R^2$ may be identical or different. m represents an integer of 1 to 3.

  (2)

In the formula, $R^3$ represents an alkyl group having one or more epoxy groups as a part of a chain. In a case in which there is more than one $R^3$, each $R^3$ may be identical or different. $R^4$ represents a hydrogen atom, an alkyl group, a heterocyclic group, an aryl group, or an alkenyl group. In a case in which there is more than one $R^4$, each $R^4$ may be identical or different. $R^5$ represents a hydrogen atom, an alkyl group, an acyl group, or an aryl group. In a case in which there is more than one $R^5$, each $R^5$ may be identical or different. l represents an integer of 0 to 2, and n represents 1 or 2. However, l+n≤3.

  (3)

In the formula, $R^6$ represents a hydrogen atom, an alkyl group, a cycloalkyl group, a heterocyclic group, an aryl group, a heteroaryl group, or an alkenyl group. $R^7$ represents a hydrogen atom, an alkyl group, an acyl group, or an aryl group. k represents 0 or 1. $A^1$ represents an organic group containing at least two carboxyl groups, sulfo groups, thiol groups, phenolic hydroxyl groups, or derivatives thereof. However, in a case in which the derivatives each have a cyclic condensed structure from two of the carboxyl group, the sulfo group, the thiol group, and the phenolic hydroxyl group, $A^1$ represents an organic group having at least one of the cyclic condensed structures.

The alkyl groups in $R^1$ to $R^7$ each represent, for example, a saturated aliphatic hydrocarbon group such as a methyl group, an ethyl group, an n-propyl group, an isopropyl group, an n-butyl group, a sec-butyl group, a tert-butyl group, a cyclopropyl group, a cyclohexyl group, a norbornyl group, or an adamantyl group, which may or may not have a substituent. The substituent is not particularly limited, and examples thereof include an alkoxy group and an aryl group, which may further have a substituent. In addition, the carbon number of the alkyl group is not particularly limited, but is preferably 1 or more and 20 or less, more preferably 1 or more and 8 or less in terms of availability and cost. In addition, the alkoxy group listed above as the substituent represents, for example, a functional group with one of ether bonds substituted with an aliphatic hydrocarbon group, such as a methoxy group, an ethoxy group, and a propoxy group. The carbon number of the alkoxy group is not particularly limited, but preferably falls within the range of 1 or more and 20 or less.

The acyl groups in $R^2$, $R^5$, and $R^7$ each represent a functional group with one of carbonyl bonds substituted with an aliphatic hydrocarbon group or an aromatic group, such as an acetyl group, a hexanoyl group, or a benzoyl group, and this aliphatic hydrocarbon group or the aromatic group may or may not have a substituent. The carbon number of the acyl group is not particularly limited, but preferably falls within the range of 2 or more and 40 or less.

The aryl groups in $R^1$, $R^2$, $R^4$, $R^5$, $R^6$, and $R^7$ each represent, for example, an aromatic hydrocarbon group such as a phenyl group, a naphthyl group, a biphenyl group, an anthracenyl group, a phenanthryl group, a terphenyl group, and a pyrenyl group, or an aromatic heterocyclic group such as a furanyl group, a thiophenyl group, a benzofuranyl group, a dibenzofuranyl group, a pyridyl group, or a quinolinyl group, which may or may not have a substituent. The carbon number of the aryl group is not particularly limited, but preferably falls within the range of 3 to 40.

The heterocyclic groups in $R^1$, $R^4$, and $R^6$ each represents a group derived from an aliphatic ring having an atom other than carbon in the ring, such as a pyran ring, a piperidine ring, or an amide ring, which may or may not have a substituent. The carbon number of the heterocyclic group is not particularly limited, but preferably falls within the range of 2 or more and 20 or less.

The alkenyl groups in $R^1$, $R^4$, and $R^6$ each represents an unsaturated aliphatic hydrocarbon group including a double bond, such as a vinyl group, an allyl group, or a butadienyl group, which may or may not have a substituent. The carbon number of the alkenyl group is not particularly limited, but preferably falls within the range of 2 or more and 20 or less.

The alkyl group $R^3$ having an epoxy group as a part of a chain represents an alkyl group having, as a part of a chain, a 3-membered cyclic ether structure formed by combining two adjacent carbon atoms with one oxygen atom. This includes a case of using two adjacent carbon atoms included in the main chain with the longest continuous carbon in the alkyl group, and a case of using two adjacent carbon atoms included in the part other than the main chain, or the so-called side chain therein.

The respective derivatives of the carboxyl group, the sulfo group, the thiol group, and the phenolic hydroxyl group in $A^1$ represent, for example, as acyclic condensed structures, a carboxylic acid ester, a sulfonic acid ester, a thioester, a thioether, a phenyl ether, a carboxylic acid anhydride, an amide compound or an imide compound produced by a reaction between a carboxylic acid anhydride and an amine compound, and the like.

The cyclic condensed structure from two of a carboxyl group, a sulfo group, a thiol group, and a phenolic hydroxyl group, represents, for example, a cyclic acid anhydride structure, a cyclic ester structure, a cyclic thioester structure, a cyclic ether structure, a cyclic thioether structure, or the like. The organic group represents, for example, the aforementioned alkyl group, cycloalkyl group, heterocyclic group, aryl group, heteroaryl group, or alkenyl group.

The gate insulating layer preferably includes at least a polysiloxane containing the silane compound represented by the general formula (1) as a polymerized component. The introduction of the silane compound represented by the general formula (1) as a polymerized component of the polysiloxane makes it possible to, while maintaining high transparency in the visible light region, enhance the insulating property and chemical resistance of the film, and form an insulating layer with fewer traps therein.

In addition, when at least one of the m groups $R^1$ in the general formula (1) is an aryl group, flexibility of the insulating film is improved, thereby allowing the generation of cracks to be prevented, which is preferable.

Specific examples of the silane compound represented by the general formula (1) include vinyltrimethoxysilane, vinyltriethoxysilane, 3-methacryloxypropyltrimethoxysilane, 3-methacryloxypropyltriethoxysilane, methyltrimethoxysilane, methyltriethoxysilane, ethyltrimethoxysilane, ethyltriethoxysilane, propyltrimethoxysilane, propyltriethoxysilane, hexyltrimethoxysilane, octadecyltrimethoxysilane, octadecyltriethoxysilane, phenyltrimethoxysilane, phenyltriethoxysilane, p-tolyltrimethoxysilane, benzyltrimethoxysilane, α-naphthyltrimethoxysilane, β-naphthyltrimethoxysilane, 3-aminopropyltriethoxysilane, N-(2-aminoethyl)-3-aminopropyltrimethoxysilane, 3-chloropropyltrimethoxysilane, dimethyldimethoxysilane, dimethyldiethoxysilane, diphenyldimethoxysilane, diphenyldiethoxysilane, methylphenyldimethoxysilane, methylvinyldimethoxysilane, methylvinyldiethoxysilane, 3-aminopropylmethyldimethoxysilane, N-(2-aminoethyl)-3-aminopropylmethyldimethoxysilane, 3-chloropropylmethyldimethoxysilane, 3-chloropropylmethyldiethoxysilane, cyclohexylmethyldimethoxysilane, 3-methacryloxypropyldimethoxysilane, octadecylmethyldimethoxysilane, trimethoxysilane, trifluoroethyltrimethoxysilane, trifluoroethyltriethoxysilane, trifluoroethyltriisopropoxysilane, trifluoropropyltrimethoxysilane, trifluoropropyltriethoxysilane, trifluoropropyltriisopropoxysilane, heptadecafluorodecyltrimethoxysilane, heptadecafluorodecyltriethoxysilane, heptadecafluorodecyltriisopropoxysilane, tridecafluorooctyltriethoxysilane, tridecafluorooctyltrimethoxysilane, tridecafluorooctyltriisopropoxysilane, trifluoroethylmethyldimethoxysilane, trifluoroethylmethyldiethoxysilane, trifluoroethylmethyldiisopropoxysilane, trifluoropropylmethyldimethoxysilane, trifluoropropylmethyldiethoxysilane, trifluoropropylmethyldiisopropoxysilane, heptadecafluorodecylmethyldimethoxysilane, heptadecafluorodecylmethyldiethoxysilane, heptadecafluorodecylmethyldiisopropoxysilane, tridecafluorooctylmethyldimethoxysilane, tridecafluorooctylmethyldiethoxysilane, tridecafluorooctylmethyldiisopropoxysilane, trifluoroethylethyldimethoxysilane, trifluoroethylethyldiethoxysilane, trifluoroethylethyldiisopropoxysilane, trifluoropropylethyldimethoxysilane, trifluoropropylethyldiethoxysilane, trifluoropropylethyldiisopropoxysilane, heptadecafluorodecylethyldimethoxysilane, heptadecafluorodecylethyldiethoxysilane, heptadecafluorodecylethyldiisopropoxysilane, tridecafluorooctylethyldiethoxysilane, tridecafluorooctylethyldimethoxysilane, tridecafluorooctylethyldiisopropoxysilane, and p-trifluorophenyltriethoxysilane.

Among the foregoing silane compounds, in order to increase the crosslinking density, and thus improve the chemical resistance and the insulating property, it is preferable to use vinyltrimethoxysilane, vinyltriethoxysilane, methyltrimethoxysilane, methyltriethoxysilane, ethyltrimethoxysilane, ethyltriethoxysilane, propyltrimethoxysilane, propyltriethoxysilane, hexyltrimethoxysilane, octadecyltrimethoxysilane, octadecyltriethoxysilane, phenyltrimethoxysilane, p-tolyltrimethoxysilane, benzyltrimethoxysilane, α-naphthyltrimethoxysilane, β-naphthyltrimethoxysilane, trifluoroethyltrimethoxysilane, trimethoxysilane, or p-trifluorophenyltriethoxysilane, with m=1. In addition, from the viewpoint of mass productivity, it is preferable to use vinyltrimethoxysilane, methyltrimethoxysilane, ethyltrimethoxysilane, propyltrimethoxysilane, hexyltrimethoxysilane, octadecyltrimethoxysilane, octadecyltrimethoxysilane, phenytrimethoxysilane, p-tolyltrimethoxysilane, benzyltrimethoxysilane, α-naphthyltrimethoxysilane, β-naphthyltrimethoxysilane, trifluoroethyltrimethoxysilane, or trimethoxysilane, where $R^2$ is a methyl group.

In addition, preferred examples include a combination of two or more of the silane compounds represented by the general formula (i). Above all, the combination of a silane compound having an alkyl group and a silane compound having an aryl group is particularly preferred, because a balance can be achieved between a high insulating property and flexibility for the prevention of cracks.

In addition, the gate insulating layer preferably contains, from the viewpoints of the insulating property and chemical resistance, at least a polysiloxane containing, as copolymerized components, a silane compound represented by the general formula (1) and an epoxy group-containing silane compound represented by the general formula (2).

Specific examples of the epoxy group-containing silane compound represented by the general formula (2) include γ-glycidoxypropyltrimethoxysilane, β-(3,4-epoxycyclohexyl)ethyltrimethoxysilane, γ-glycidoxypropyltriethoxysilane, β-(3,4-epoxycyclohexyl)ethyltriethoxysilane, γ-glycidoxypropyltriisopropoxysilane, 1-(3,4-epoxycyclohexyl)ethyltriisopropoxysilane, γ-glycidoxypropylmethyldimethoxysilane, β-(3,4-epoxycyclohexyl)ethylmethyldimethoxysilane, γ-glycidoxypropylmethyldiethoxysilane, β-(3,4-epoxycyclohexyl)ethylmethyldiethoxysilane, γ-glycidoxypropylmethyldiisopropoxysilane, 3-(3,4-epoxycyclohexyl)ethylmethyldiisopropoxysilane, γ-glycidoxypropylethyldimethoxysilane, β-(3,4-epoxycyclohexyl)ethylethyldimethoxysilane, γ-glycidoxypropylethyldiethoxysilane, β-(3,4-epoxycyclohexyl)ethylethyldiethoxysilane, γ-glycidoxypropylethyldiisopropoxysilane, β-(3,4-epoxycyclohexyl)ethylethyldiisopropoxysilane, β-(3,4-epoxycyclohexyl)propyltrimethoxysilane, and γ-glycidoxyethyltrimethoxysilane.

Among the foregoing examples, in order to increase the crosslinking density, and thus improve the chemical resistance and the insulating property, it is preferable to use γ-glycidoxypropyltrimethoxysilane, β-(3,4-epoxycyclohexyl)ethyltrimethoxysilane, γ-glycidoxypropyltriethoxysilane, β-(3,4-epoxycyclohexyl)ethyltriethoxysilane, γ-glycidoxypropyltriisopropoxysilane, β-(3,4-epoxycyclohexyl)ethyltriisopropoxysilane, β-(3,4-epoxycyclohexyl)propyltrimethoxysilane, or γ-glycidoxyethyltrimethoxysilane, with n=1 and l=0. In addition, from the viewpoint of mass productivity, it is particularly preferable to use γ-glycidoxypropyltrimethoxysilane, 3-(3,4-epoxycyclohexyl)ethyltrimethoxysilane, β-(3,4-epoxycyclohexyl)propyltrimethoxysilane, or γ-glycidoxyethyltrimethoxysilane, in which $R^5$ is a methyl group.

In addition, from the viewpoints of improving the crack resistance of the gate insulating layer and reducing the hysteresis of the FET, the polysiloxane preferably further contains, as a polymerized component, a silane compound represented by the general formula (3). With the silane compound represented by the general formula (3) as a polymerized component, the polysiloxane exhibits excellent solubility in an alkali developer at the time of applying lithography to the insulating layer. This solubility makes it possible to process the pattern with a high degree of accuracy in accordance with the designed dimensions, thereby leading to an excellent resolution.

From the viewpoints of improving the coatability of the semiconductor solution, low hysteresis, and the crack resistance of the gate insulating layer, $A^1$ in the general formula (3) is preferably an organic group at least two carboxyl groups or derivatives thereof or at least one cyclic acid anhydride group, more preferably a group represented by the general formula (4) or (5).

[Chemical Formula 1]

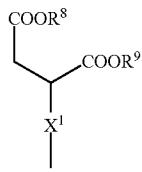

(4)

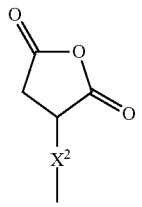

(5)

In the general formula (4), $X^1$ represents a single bond, an alkylene group having 1 to 10 carbon atoms, or an arylene group having 6 to 15 carbon atoms. $R^8$ and $R^9$ each independently represent a hydrogen atom, an organic group, or a silyl group. In the general formula (5), $X^2$ represents a single bond, an alkylene group having 1 to 10 carbon atoms, or an arylene group having 6 to 15 carbon atoms.

In the polysiloxane, the content ratio of the structural unit derived from the silane compound represented by the general formula (3) to all of the silane structural units is preferably 0.5 mol % or higher, more preferably 1.0 mol % or higher, still more preferably 1.5 mol % or higher, from the viewpoints of improving the coatability of the semiconductor solution, achieving a balance between low hysteresis and the crack resistance of the gate insulating layer, and improving the resolution at the time of applying lithography to the insulating layer. In addition, from the viewpoint of preventing an increase in leak current due to moisture absorption, the content ratio is preferably 20 mol % or less, more preferably 15 mol % or less, and still more preferably 10 mol % or less. The leak current refers to a leak current flowing to an unintended part on the circuit, and in order to drive the FET with low power consumption, it is necessary to reduce the value of the leak current. The leak current value is preferably 30 pA or less, more preferably 20 pA or less, still more preferably 10 pA or less.

Specific examples of the silane compound represented by the general formula (3) include silane compounds having a carboxyl group or a derivative thereof, such as dimethoxymethylsilylmethylsuccinic acid, diethoxymethylsilylmethylsuccinic acid, dimethoxyphenylsilylmethyl succinic acid, diethoxyphenylsilylmethylsuccinic acid, trimethoxysilylmethylsuccinic acid, triethoxysilylmethylsuccinic acid, 2-dimethoxymethylsilylethysuccinic acid, 2-diethoxymethylsilylethylsuccinic acid, 2-dimethoxyphenylsilylethyl succinic acid, 2-diethoxyphenylsilylethylsuccinic acid, 2-trimethoxysilylethylsuccinic acid, 2-triethoxysilylethylsuccinic acid, 3-dimethoxymethylsilylpropylsuccinic acid, 3-diethoxymethylsilylpropylsuccinic acid, 3-dimethoxyphenylsilylpropylsuccinic acid, 3-diethoxyphenylsilylpropylsuccinic acid, 3-trimethoxysilylpropylsuccinic acid, 3-triethoxysilylpropylsuccinic acid, 4-dimethoxymethylsilylbutylsuccinic acid, 4-diethoxymethylsilylbutylsuccinic acid, 4-dimethoxyphenylsilylbutylsuccinic acid, 4-diethoxyphenylsilylbutylsuccinic acid, 4-trimethoxysilylbutylsuccinic acid, 4-triethoxysilylbutylsuccinic acid, 5-dimethoxymethylsilylpentylsuccinic acid, 5-diethoxymethylsilylpentylsuccinic acid, 5-dimethoxyphenylsilylpentylsuccinic acid, 5-diethoxyphenylsilylpentylsuccinic acid, 5-trimethoxysilylpentylsuccinic acid, 5-triethoxysilylpentylsuccinic acid, 6-dimethoxymethylsilylhexylsuccinic acid, 6-diethoximehexylsuccinic acid, 6-dimethoxyphenylsilylhexylsuccinic acid, 6-diethoxyphenylsilylhexylsuccinic acid, 6-trimethoxysilylhexylsuccinic acid, 6-triethoxysilylhexylsuccinic acid, anhydrates of compounds having these succinic acid structures, and structural units derived from compounds with these succinic acids replaced for glutaric acids.

Examples of the compound having a sulfo group or a derivative thereof include 5-dimethoxymethylsilylpentane-1,2-disulfonic acid, 5-diethoxymethylsilylpentane-1,2-disulfonic acid, 5-dimethoxyphenylsilylpentane-1,2-disulfonic acid, 5-diethoxyphenylsilylpentane-1,2-disulfonic acid, 5-trimethoxysilylpentane-1,2-disulfonic acid, and 5-triethoxysilylpentane-1,2-disulfonic acid, and structural units derived from methyl esters thereof, ethyl esters thereof, n-propyl esters thereof, isopropyl esters thereof, n-butyl esters thereof, and sec-butyl esters thereof, and additionally, t-butyl esters thereof.

Examples of the compound having a thiol group or a derivative thereof include 3-(3-dimethoxymethylsilylpropyloxy)propane-1,2-dithiol, 3-(3-diethoxymethylsilylpropyloxy)propane-1,2-dithiol, 3-(3-dimethoxyphenylsilylpropyloxy)propane-1,2-dithiol, 3-(3-diethoxyphenylsilylpropyloxy)propane-1,2-dithiol, 3-(3-trimethoxysilylpropyloxy)propane-1,2-dithiol, and 3-(3-triethoxysilylpropyloxy)propane-1,2-dithiol, and structural units derived from methylthioethers thereof, ethylthioethers thereof, n-propylthioethers thereof, isopropylthioethers thereof, n-butylthioethers thereof, and sec-butylthioethers thereof, and additionally, t-butylthioethers thereof.

Examples of the compound having a phenolic hydroxyl group or a derivative thereof include catechol, resorcinol, hydroquinone or phloroglucinol having 3-dimethoxymethylsilylpropyl group, 3-diethoxymethylsilylpropyl group, 3-dimethoxyphenylsilylpropyl group, 3-diethoxyphenylsilylpropyl group, 3-trimethoxysilylpropyl group, or 3-triethoxysilylpropyl group, and structural units derived from methyl ethers thereof, ethyl ether thereof, n-propyl ethers thereof, isopropyl ethers thereof, n-butyl ethers thereof, and sec-butyl ethers thereof, and additionally, t-butylethers thereof.

Examples of the compound containing different types of groups among a carboxyl group, a sulfo group, a thiol group, a phenolic hydroxyl group, or derivatives thereof, include 1-carboxyl-2-sulfo-5-trimethoxysilylpentane, 1-carboxyl-2-mercapto-5-trimethoxysilylpentane, 1-sulfo-2-mercapto-5-trimethoxysilylpentane, 1-carboxyl-2-hydroxy-4-trimethoxysilylbenzene, 1-sulfo-2-hydroxy-4-trimethoxysilylbenzene, 1-mercapto-2-hydroxy-4-trimethoxysilylbenzene, and regioisomers that differ in the positions of the substituents, and in addition thereto, structural units derived from methyl (thio)esters thereof, ethyl (thio)esters thereof, n-propyl (thio)esters thereof, isopropyl (thio)esters thereof, n-butyl (thio)esters thereof, sec-butyl (thio)esters thereof, t-butyl (thio)esters thereof, methyl (thio)ethers thereof, ethyl (thio)ethers thereof, n-propyl (thio)ethers thereof, isopropyl (thio)ethers thereof, n-butyl (thio)ethers thereof, sec-butyl (thio)ethers thereof, t-butyl (thio)ethers thereof, cyclic (thio)esters, and cyclic (thio) ethers.

Among others, from the viewpoints of improvement in the coatability of the semiconductor solution, low hysteresis, and the crack resistance of the gate insulating layer, a structural unit derived from a silane compound having at least two carboxyl groups or derivatives thereof, or at least one cyclic acid anhydride group unit is preferred, a structural unit derived from a silane compound having a succinic acid, a succinic anhydride structure, or a derivative thereof is more preferred, a structural unit derived from a silane compound having a succinic acid or a succinic anhydride structure is further preferred, structural units derived from 3-dimethoxymethylsilylpropylsuccinic acid, 3-diethoxymethylsilylpropylsuccinic acid, 3-dimethoxyphenylsilylpropylsuccinic acid, 3-diethoxyphenylsilylpropylsuccinic acid, 3-trimethoxysilylpropylsuccinic acid, 3-triethoxysilylpropylsuccinic acid, and anhydrides thereof are further preferred, and structural units derived from 3-trimethoxysilylpropyl succinic acid, 3-triethoxysilylpropyl succinic acid, and anhydrides thereof are particularly preferred.

From the viewpoint of improvement in crack resistance by the introduction of a crosslinked structure, the polysiloxane in the gate insulating layer preferably further contains a silane compound represented by the general formula (6) as a polymerized component.

$$B^{10}R^{10}{}_jSi(OR^{11})_{2-j} \tag{6}$$

In the general formula (6), $R^{10}$ represents a hydrogen atom, an alkyl group, a heterocyclic group, an aryl group, or an alkenyl group. $R^{11}$ represents a hydrogen atom, an alkyl group, an acyl group, or an aryl group. j represents 0 or 1. $B^1$ represents an organic group including an addition reaction structure between acrylic groups and/or methacrylic groups.

The alkyl group, heterocyclic group, aryl group, and alkenyl group of $R^{10}$, and the alkyl group, acyl group, and aryl group of $R^{11}$ are as described above.

The organic group including an addition reaction structure between acrylic groups and/or methacrylic groups is a group obtained by the development of an addition reaction between the acrylic groups and/or methacrylic groups included in the silane compound having the acrylic groups and/or methacrylic groups, which is a silane compound represented by the general formula (6), and acrylic groups and/or methacrylic groups. The addition reaction is a crosslinking reaction associated with radical polymerization by light or heat.

In the polysiloxane with the silane compound represented by the general formula (6) as a polymerized component, the content ratio of the structural unit derived from the silane compound represented by the general formula (6) to all of the silane structural units is preferably 5 mol % or higher, more preferably 15 mol % or higher, still more preferably 25 mol % or higher, from the viewpoints of improving the crack resistance. In addition, in a case in which the crosslinking density is excessively high, the film swells due to a wet process such as development in the photolithography step, thereby decreasing the resolution of the pattern. From the viewpoint of preventing the decrease, the content ratio is preferably 50 mol % or lower, more preferably 45 mol % or lower, and still more preferably 40 mol % or lower.

Specific examples of the silane compound represented by the general formula (6) include structures derived from 3-acryloxypropyldimethoxymethylsilane, 3-methacryloxypropyldimethoxymethylsilane, 3-acryloxypropyldiethoxymethylsilane, 3-methacryloxypropyldiethoxymethylsilane, 3-acryloxypropyldimethoxyphenylsilane, 3-methacryloxypropyldimethoxyphenylsilane, 3-acryloxypropyldiethoxyphenylsilane, 3-methacryloxypropyldiethoxyphenylsilane, 3-acryloxypropyltrimethoxysilane, 3-methacryloxypropyltrimethoxysilane, 3-acryloxypropyltriethoxysilane, 3-methacryloxypropyltriethoxysilane, 4-acryloxybutyldimethoxymethylsilane, 4-methacryloxybutyldimethoxymethylsilane, 4-acryloxybutyldiethoxymethylsilane, 4-methacryloxybutyldiethoxymethylsilane, 4-acryloxybutyldimethoxyphenylsilane, 4-methacryloxybutyldimethoxyphenylsilane, 4-acryloxybutyldiethoxyphenylsilane, 4-methacryloxybutyldiethoxyphenylsilane, 4-acryloxybutyltrimethoxysilane, 4-methacryloxybutyltrimethoxysilane, 4-acryloxybutyltriethoxysilane, 4-methacryloxybutyltriethoxysilane, 5-acryloxypentyldimethoxymethylsilane, 5-methacryloxypentyldimethoxymethylsilane, 5-acryloxypentyldiethoxymethylsilane, 5-methacryloxypentyldiethoxymethylsilane, 5-acryloxypentyldimethoxyphenylsilane, 5-methacryloxypentyldimethoxyphenylsilane, 5-acryloxypentyldiethoxyphenylsilane, 5-methacryloxypentyldiethoxyphenylsilane, 5-acryloxypentyltrimethoxysilane, 5-methacryloxypentyltrimethoxysilane, 5-acryloxypentyltriethoxysilane, 5-methacryloxypentyltriethoxysilane, 6-acryloxyhexyldimethoxymethylsilane, 6-methacryloxyhexyldimethoxymethylsilane, 6-acryloxyhexyldiethoxymethylsilane, 6-methacryloxyhexyldiethoxymethylsilane, 6-acryloxyhexyldimethoxyphenylsilane, 6-methacryloxyhexyldimethoxyphenylsilane, 6-acryloxyhexyldiethoxyphenylsilane, 6-methacryloxyhexyldiethoxyphenylsilane, 6-acryloxyethylhexyltrimethoxysilane, 6-methacryloxyhexyltrimethoxysilane, 6-acryloxyhexyltriethoxysilane, 6-methacryloxyhexyltriethoxysilane, through addition reactions between acrylic group and/or methacrylic groups.

Above all, from the viewpoint of the reactivity of the addition reaction, structures are preferred which are obtained through addition reactions of structural units derived from 3-acryloxypropyldimethoxymethylsilane, 3-methacryloxypropyldimethoxymethylsilane, 3-acryloxypropyldiethoxymethylsilane, 3-methacryloxypropyldiethoxymethylsilane, 3-acryloxypropyldimethoxyphenylsilane, 3-methacryloxypropyldimethoxyphenylsilane, 3-acryloxypropyldiethoxyphenylsilane, 3-methacryloxypropyldiethoxyphenylsilane, 3-acryloxypropyltrimethoxysilane, 3-methacryloxypropyltrimethoxysilane, 3-acryloxypropyltriethoxysilane, and 3-methacryloxypropyltriethoxysilane, and structures are more preferred which are obtained through addition reactions of structural units derived from 3-acryloxypropyltrimethoxysilane 3-methacryloxypropyltrimethoxysilane, 3-acryloxypropyltriethoxysilane, 3-methacryloxypropyltriethoxysilane.

From the viewpoint of achieving a balance between a high insulating property and crack resistance, for the polysiloxane in the gate insulating layer, it is preferable to combine one or more structural units derived from silane compounds represented by the formulas other than the general formulas (3) and (6). The insulating property in the present invention, which is regarded as an index of resistance to electricity passing, refers to a volume resistivity of $10^8$ Ω·cm or more.

The polysiloxane included in the gate insulating layer can be obtained by the following method, for example. The silane compound is all dissolved in a solvent, and after adding an acid catalyst and water to the solvent over 1 to 180 minute, hydrolyzed at 15 to 80° C. for 1 to 180 minutes. The temperature during the hydrolysis reaction is more preferably from 15 to 55° C. This reaction solution is heated at 50° C. or higher, and equal to or higher than the boiling point of the solvent for 1 to 100 hours for developing a condensation reaction, thereby making it possible to obtain the polysiloxane.

In addition, as for various conditions for the hydrolysis, for example, the acid concentration, the reaction temperature, and the reaction time are set in consideration of the reaction scale, the size and shape of the reaction container, and the like, thereby making it possible to obtain physical properties suited for intended uses.

Examples of the acid catalyst used for the hydrolysis reaction of the silane compound include acid catalysts such as formic acid, oxalic acid, hydrochloric acid, sulfuric acid, acetic acid, trifluoroacetic acid, phosphoric acid, polyphosphoric acid, polycarboxylic acid, or an anhydride thereof, and ion exchange resins. The content of the acid catalyst is preferably 0.05 parts by mass or more, more preferably 0.1 parts by mass or more, with respect to 100 parts by mass of the whole silane compound which is a copolymerized component of the polysiloxane. Further, the content is preferably 10 parts by mass or less, and more preferably 5 parts by mass or less. When the content of the acid catalyst is 0.05 parts by mass or more, the hydrolysis reaction proceeds sufficiently, and when the content is 10 parts by mass or less, the rapid reaction can be inhibited.

As the solvent used for the hydrolysis reaction, an organic solvent is preferred, and examples thereof can include alcohols such as ethanol, propanol, butanol, and 3-methyl-3-methoxy-1-butanol, glycols such as ethylene glycol and propylene glycol, ethers such as ethylene glycol monomethyl ether, propylene glycol monomethyl ether, propylene glycol monobutyl ether, and diethyl ether, ketones such as methyl isobutyl ketone and diisobutyl ketone, amides such as dimethyl formamide and dimethyl acetamide, acetates such as ethyl acetate, ethyl cellosolve acetate, 3-methyl-3-methoxy-1-butanol acetate, aromatic or aliphatic hydrocarbons such as toluene, xylene, hexane, and cyclohexane, as well as γ-butyrolactone, N-methyl-2-pyrrolidone, and dimethyl sulfoxide. The amount of the solvent preferably falls within the range of 50 parts by mass or more and 500 parts by mass or less with respect to 100 parts by mass of the total silane compound which is a copolymerized component of the polysiloxane. As long as the amount is 50 parts by mass or more, rapid reactions can be inhibited, and as long as the amount is 500 parts by mass or less, hydrolysis can be developed to proceed sufficiently.

In addition, ion exchange water is preferred as water for use in the hydrolysis. The amount of water can be arbitrarily selected, but water that is equivalent in mol to or more than the epoxy group is preferably added in addition to water that is equivalent in mol to the alkoxyl group in the silane compound. In order to increase the degree of polymerization for the polysiloxane, it is also possible to carry out reheating or add a base catalyst.

The fact that the polysiloxane includes structural units derived from silane compounds represented by the general formula (3) and/or (6) can be determined by one of various organic analysis methods such as elemental analysis, nuclear magnetic resonance analysis, and infrared spectroscopic analysis, or by the combination of two or more thereof.

The material used for the gate insulating layer may further contain a metal compound including a bond between a metal atom and an oxygen atom. The metal compound including the bond between the metal atom and the oxygen atom is not particularly limited, and examples of the metal compound include a metal oxide, a metal hydroxide, and a metal chelate compound. In particular, the metal chelate represented by the general formula (7) is preferred. The metal atom included in the metal compound is not particularly limited, but examples of the metal atom include magnesium, aluminum, titanium, chromium, manganese, cobalt, nickel, copper, zinc, gallium, zirconium, ruthenium, palladium, indium, hafnium, and platinum. Among the examples, aluminum is preferred from the viewpoint of availability, cost, and metal chelate stability.

$$R^{12}{}_xM(OR^{13})_{y-x} \qquad (7)$$

In this formula, $R^{12}$ represents a monovalent bidentate ligand. In a case in which there is more than one $R^{12}$, each $R^{12}$ may be identical or different. $R^{13}$ represents hydrogen, an alkyl group, an acyl group, or an aryl group. In a case in which there is more than one $R^{13}$, each $R^{13}$ may be identical or different. M represents a metal atom with a valence of y. y is 1 to 6. x represents an integer from 1 to y.

The monovalent bidentate ligand represented by $R^{12}$ refers to a compound having one group linked to a metal to be coordinated by a covalent bond and one group linked to the metal by a coordination bond. Examples of the group linked by a covalent bond include a group capable of covalent bonding to a metal atom by deprotonation, such as a hydroxyl group, a mercapto group, and a carboxyl group. Examples of the group for linked by a coordination bond include a carbonyl group, a thiocarbonyl group, a nitrile group, an amino group, an imino group, and a phosphine oxide group. The carbon number of $R^{12}$ is not particularly limited, but is preferably 3 or more and 20 or less, more preferably 3 or more and 12 or less from the viewpoint of thermal decomposability at the time of film formation.

The alkyl group of $R^{13}$ represents, for example, a saturated aliphatic hydrocarbon group such as a methyl group, an ethyl group, an n-propyl group, an isopropyl group, an n-butyl group, a sec-butyl group, a tert-butyl group, a cyclopropyl group, a cyclohexyl group, a norbornyl group, or an adamantyl group, which may or may not have a substituent. In the case of having a substituent, the substituent is not particularly limited, and examples thereof include an alkoxy group and an aryl group. These substituents may further have a substituent. In addition, the carbon number of the alkyl group is not particularly limited, but is preferably 1 or more and 20 or less, more preferably 1 or more and 8 or less in terms of availability and cost.

The acyl group in $R^{13}$ represents a functional group with one of carbonyl bonds substituted with an aliphatic hydrocarbon group or an aromatic group, such as an acetyl group, a hexanoyl group, or a benzoyl group, and this aliphatic hydrocarbon group or the aromatic group may or may not have a substituent. The carbon number of the acyl group is not particularly limited, but preferably falls within the range of 2 or more and 40 or less.

The aryl groups in $R^{13}$ represents, for example, an aromatic hydrocarbon group such as a phenyl group, a naphthyl group, a biphenyl group, an anthracenyl group, a phenanthryl group, a terphenyl group, and a pyrenyl group, or an aromatic heterocyclic such as a furanyl group, a thiophenyl group, a benzofuranyl group, a dibenzofuranyl group, a pyridyl group, or a quinolinyl group, which may or may not have a substituent. The carbon number of the aryl group is not particularly limited, but preferably falls within the range of 3 to 40.

In addition, the alkoxy group listed above as the substituent represents, for example, a functional group with one of ether bonds substituted with an aliphatic hydrocarbon group, such as a methoxy group, an ethoxy group, and a propoxy group, and the aliphatic hydrocarbon group may or may not have a substituent. The carbon number of the alkoxy group is not particularly limited, but preferably falls within the range of 1 or, more and 20 or less.

The y-valent metal atom is not particularly limited as long as the metal atom forms a metal chelate, but examples of the metal atom include magnesium, aluminum, titanium, chromium, manganese, cobalt, nickel, copper, zinc, gallium, zirconium, ruthenium, palladium, indium, hafnium, and platinum. y is 1 to 6, which is a value determined depending on the type of metal atom. Among the examples, a metal selected from the group consisting of aluminum, titanium, zirconium, and indium is preferred from the viewpoints of availability and cost.

Among metal chelates, the aluminum chelate represented by the following general formula (8) is preferred which is excellent in stability.

$$R^{14}{}_3Al \qquad (8)$$

In this formula, $R^{14}$ is identical with $R^{12}$ in the general formula (7), and each $R^{14}$ may be identical or different.

In the general formulas (7) and (8), a group derived from a β diketone or a group derived from a β ketoester is particularly preferred as the monovalent bidentate ligand represented by $R^{14}$, because the group can be obtained at low cost, and is capable of stable chelate formation.

Specific examples of the β diketone include 2,4-pentanedione, 2,4-hexanedione, 2,4-heptanedione, 3,5-heptanedione, 2,4-octanedione, 3,5-octanedione, 2,4-decanedione, 2,4-dodecanedione, 2,6-dimethyl-3,5-heptanedione, 2,2,6-trimethyl-3,5-heptanedione, 2,2,6,6-tetramethyl-3,5-heptanedione, 2,2,6,6-tetramethyl-3,5-octanedione, 3-methyl-2,4-pentanedione, 3-ethyl-3,5-heptanedione, benzoylacetone, dibenzoylmethane, 1-(pyridyl-2-yl)-1,3-butanedione, 1-(pyridyl-2-yl)-2,5-pentanedione, and 1-amino-2,4-pentanedione.

Specific examples of the β ketoester include methyl acetoacetate, ethyl acetoacetate, isopropyl acetoacetate, t-butyl acetoacetate, n-butyl acetoacetate, phenyl acetoacetate, ethyl propanoyl acetate, ethyl butanoyl acetate, ethyl pentanoyl acetate, ethylhexanoyl acetate, ethyl octanoyl acetate, ethyl decanoyl acetate, ethyldodecanoyl acetate, ethyl-2-methylpropanoyl acetate, ethyl-2,2-dimethylbutanoyl acetate, ethylbenzoyl acetate, ethyl-p-anisoyl acetate, ethyl-2-pyridyloyl acetate, ethyl acrylyl acetate, 1-aminobutanoyl acetate, and ethyl-α-acetyl propanoate.

In the aluminum chelate represented by the general formula (8), at least one of the three groups $R^{14}$ is different from the other two in consideration of the solubility of the chelate in the solvent and the stability of the composition. For the same reasons, at least one $R^{14}$ is preferably a β-ketoester.

Specific examples of the metal chelate as mentioned above include the following examples. Examples of the aluminum chelate include diethoxyaluminum (2,4-pentanedionate), diisopropoxyaluminum (2,4-pentanedionate), diethoxyaluminum (2,4-hexanedionate), diethoxyaluminum (3,5-hexanedionate), diethoxyaluminum (2,4-octanedionate), diethoxyaluminum benzoylacetonate, diethoxyaluminum (1-(pyridyl-2-yl)-1,3-butanedionate), diethoxyaluminum methyl acetoacetate, diisopropoxyaluminum methyl acetoacetate, diethoxyaluminum ethyl acetoacetate, diethoxyaluminum isopropyl acetoacetate, diethoxyaluminum tert-butyl acetoacetate, diethoxyaluminum ethylbutanoylacetate, diethoxyaluminum ethylbenzoylacetate, ethoxyaluminum bis(2,4-pentanedionate), isopropoxyaluminum bis(2,4-pentanedionate), ethoxyaluminum bis(2,4-hexanedionate), ethoxyaluminum bis(3,5-hexanedionate), ethoxyaluminum bis(2,4-octanedionate), ethoxyaluminum bis(benzoylacetonate), ethoxyaluminum bis(1-(pyridyl-2-yl)-1,3-butanedionate), ethoxy aluminum bis(ethylacrylylacetate), ethoxyaluminum bis(methyl acetoacetate), isopropoxyaluminum bis(methyl acetoacetate), ethoxyaluminum bis(ethyl acetoacetate), ethoxyaluminum bis(isopropyl acetoacetate), ethoxyaluminum bis(t-butylacetoacetate), ethoxyaluminum bis(ethylbutanoylacetate), ethoxyaluminum bis(ethylbenzoylacetate), ethoxyaluminum bis(ethylacrylylacetate), aluminum tris(2,4-pentanedionate), aluminum tris(1,1,3-trifluoro-2,4-pentanedionate), aluminum tris(2,4-hexanedionate), aluminum tris(3,5-hexanedionate), aluminum tris(2,4-octanedionate), aluminum tris(benzoylacetonate), aluminum tris(1-(pyridin-2-yl)-1,3-butanedionate), aluminum tris(2,6-dimethyl-3,5-heptanedionate), aluminum tris(2,2,6-trimethyl-3,5-heptanedionate), aluminum tris(ethyl (2,2,6,6-tetramethyl-3,5-octanedionate), aluminum tris (1-amino-2,4-pentanedionate), aluminum tris(methyl acetoacetate), aluminum tris(ethyl acetoacetate), aluminum tris(isopropyl acetoacetate), aluminum tris(t-butyl acetoacetate), aluminum tris(ethylbutanoylacetate), aluminum tris(ethylpentanoylacetate), aluminum tris(ethyl-2-methylpropanoyl, aluminum tris(ethylbenzoylacetate), aluminum tris(ethyl-2-pyridyloylacetate), aluminum tris(l-aminobutanoylacetate), aluminum tris(ethyl-α-acetylpropanate), aluminum tris (ethylacrylylacetate), ethoxyaluminum mono(ethyl acetoacetate)mono(isopropyl acetoacetate), ethoxyaluminum mono (ethyl acetoacetate)mono(3,5-hexanedionate), aluminum bis (ethyl acetoacetate)mono(isopropyl acetoacetate), aluminum bis(ethyl acetoacetate)mono(3,5-hexanedionate), aluminum tris(diethylmalonate), aluminum tris(dioctylmalonate), aluminum tris(diethyl(methylmalonate)), aluminum tris(diethyl(phenylmalonate)), aluminum tris(ethylthioacetoacetate), aluminum tris(2-acetylphenolate), and aluminum tris(2-(pyridin-2-yl) phenolate).

Examples of the zirconium chelate include trisethoxyzirconium (2,4-pentanedionate), trisisopropoxyzirconium (2,4-pentanedionate), trisethoxyzirconium (2,4-hexanedionate), trisethoxyzirconium (3,5-hexanedionate), trisethoxyzirconium benzoylacetonate, trisethoxyzirconium methyl acetoacetate, trisisopropoxyzirconium methyl acetoacetate, trisethoxyzirconium ethyl acetoacetate, trisethoxyzirconium isopropyl acetoacetate, trisethoxyzirconium-t-butyl acetoacetate, trisethoxyzirconium ethylbutanoyl acetate, trisethoxyzirconium ethylbenzoyl acetate, diethoxyzirconium bis(2,4-pentanedionate), diisopropoxyzirconium bis(2,4-pentanedionate), diethoxyzirconium bis(2,4-hexanedionate), diethoxyzirconium bis(3,5-hexanedionate), diethoxyzirconium bis(benzoyl acetoacetate), diethoxyzirconium bis(methyl acetoacetate), diisopropoxyzirconium bis(methyl acetoacetate), diethoxyzirconium bis(ethyl acetoacetate), diethoxyzirconium bis(Isopropyl acetoacetate), diethoxyzirconium bis(t-butyl acetoacetate), diethoxyzirconium bis(ethylbutanoyl acetate), diethoxy zirconium bis(ethylbenzoyl acetate), ethoxyzirconium tris(2,4-pentanedionate), isopropoxyzirconium tris(2,4-pentanedionate), ethoxyzirconium tris(2,4-hexanedionate), ethoxyzirconium tris(3,5-hexanedionate), ethoxyzirconium tris(benzoylacetonate), ethoxyzirconium tris(methyl acetoacetate), isopropoxyzirconium tris(methyl acetoacetate), ethoxyzirconium tris(ethyl acetoacetate), ethoxyzirconium tris(isopropyl acetoacetate), ethoxyzirconium tris(t-butyl acetoacetate), ethoxyzirconium tris(ethylbutanoyl acetate), ethoxyzirconium tris(ethylbenzoyl acetate), zirconium tetrakis(2,4-pentanedionate), zirconium tetrakis(2,4-hexanedionate), zirconium tetrakis(3,5-hexanedionate), zirconium tetrakis(benzoylacetonate), zirconium tetrakis(2,6-dimethyl-3,5-heptanedionate), zirconium tetrakis(2,2,6-trimethyl-3,5-heptanedionate), zirconium tetrakis(methyl acetoacetate), zirconium tetrakis(ethyl acetoacetate), zirconium tetrakis(isopropyl acetoacetate), zirconium tetrakis(t-butyl acetoacetate), zirconium tetrakis(ethylbutanoyl acetate), zirconium tetrakis(ethyl-2-methylpropanoyl acetate), zirconium tetrakis(ethylbenzoyl acetate), zirconium tetrakis(diethylmalonate), zirconium tetrakis(diethyl (methylmalonate)), ethoxyzirconium bis(ethyl acetoacetate)mono(isopropyl acetoacetate), ethoxyzirconium bis(ethyl acetoacetate)mono(3,5-hexanedionate), zirconium bis(ethyl acetoacetate)bis(isopropyl acetoacetate), and zirconium tris(ethyl acetoacetate)mono(3,5-hexanedionate).

Examples of the titanium chelate include trisethoxytitanium (2,4-pentanedionate), trisisopropoxytitanium (2,4-pentanedionate), trisethoxytitanium (2,4-hexanedionate), trisethoxytitanium (3,5-hexanedionate), trisethoxytitanium benzoylacetonate, trisethoxytitanium methyl acetoacetate, trisisopropoxytitanium methyl acetoacetate, trisethoxytitanium ethyl acetoacetate, trisethoxytitanium isopropyl acetoacetate, trisethoxytitanium t-butyl acetoacetate, trisethoxytitanium ethylbutanoyl acetate, trisethoxytitanium ethylbenzoylacetate, diethoxytitanium bis(2,4-pentanedionate), diisopropoxytitanium bis(2,4-pentanedionate), diethoxytitanium bis(2,4-hexanedionate), diethoxytitanium bis(3,5-hexanedionate), diethoxytitanium bis(benzoylacetonate), diethoxytitanium bis(methyl acetoacetate), diisopropoxytitanium bis(methyl acetoacetate), diethoxytitanium bis(ethyl acetoacetate), diethoxytitanium bis(isopropyl acetoacetate), diethoxytitanium bis(t-butyl acetoacetate), diethoxytitanium bis(ethylbutanoyl acetate), diethoxytitanium bis(ethylbenzoyl acetate), ethoxytitanium tris(2,4-pentanedionate), isopropoxytitanium tris(2,4-pentanedionate), ethoxytitanium tris(2,4-hexanedionate), ethoxytitanium tris(3,5-hexanedionate), ethoxytitanium tris(benzoyl acetoacetate), ethoxytitanium tris(methyl acetoacetate), isopropoxytitanium tris(methyl acetoacetate), ethoxytitanium tris(ethyl acetoacetate), ethoxytitanium tris(isopropyl acetoacetate), ethoxytitanium tris(t-butyl acetoacetate), ethoxytitanium tris(ethylbutanoyl acetate), ethoxytitanium tris(ethylbenzoyl acetate), titanium tetrakis(2,4-pentanedionate), titanium tetrakis(2,4-hexanedionate), titanium tetrakis(3,5-hexanedionate), titanium tetrakis(benzoylacetonate), titanium tetrakis(2,6-dimethyl-3,5-heptanedionate), titanium tetrakis(2,2,6-trimethyl-3,5-heptanedionate), titanium tetrakis(methyl acetoacetate), titanium tetrakis(ethyl acetoacetate), titanium tetrakis(isopropyl acetoacetate), titanium tetrakis(t-butyl acetoacetate), titanium tetrakis(ethylbutanoyl acetate), titanium tetrakis(ethyl-2-methylpropanoyl acetate), titanium tetrakis(ethylbenzoylacetate), titanium tetrakis(diethylmalonate), titanium tetrakis(dioctylmalonate), titanium tetrakis(diethyl(methylmalonate)), ethoxytitanium bis(ethyl acetoacetate)mono(3,5-hexanedionate), titanium bis(ethyl acetoacetate)bis(isopropyl acetoacetate), and titanium tris(ethyl acetoacetate)mono(3, 5-hexanedionate).

Examples of the indium chelate include diethoxyindium (2,4-pentanedionate), diisopropoxyindium (2,4-pentanedionate), diethoxyindium (2,4-hexanedionate), diethoxyindium (3,5-hexanedionate), diethoxyindium benzoylacetonate, diethoxyindium methyl acetoacetate, diisopropoxyindium methyl acetoacetate, diethoxyindium ethyl acetoacetate, diethoxyindium isopropyl acetoacetate, diethoxyindium t-butyl acetoacetate, diethoxyindium ethylbutanoyl acetate, diethoxyindium ethylbenzoyl acetate, ethoxyindium bis(2,4-pentanedionate), isopropoxyindium bis(2,4-pentanedionate), ehoxyindium bis(2,4-hexanedionate), ehoxyindium bis(3,5-hexanedionate), ethoxyindium bis(benzoylacetonate), ethoxyindium bis(methyl acetoacetate), isopropoxyindium bis(methyl acetoacetate), ethoxyindium bis(ethyl acetoacetate), ethoxyindium bis(isopropyl acetoacetate), ethoxyindium bis(t-butyl acetoacetate), ethoxyindium bis(ethylbutanoyl acetate), ethoxyindium bis(ethylbenzoyl acetate), indium tris(2,4-pentanedionate), indium tris(2,4-hexanedionate), indium tris(3,5-hexanedionate), indium tris(benzoylacetonate), indium tris(2,6-dimethyl-3,5-heptanedionate), indium tris(2,2,6-trimethyl-3,5-heptanedionate), indium tris(methyl acetoacetate), indium tris(ethyl acetoacetate), indium tris(isopropyl acetoacetate), indium tris(t-butyl acetoacetate), indium tris(ethylbutanoyl acetate), indium tris(ethyl-2-methylpropanoyl acetate), indium tris(ethylbenzoyl acetate), indium tris(diethylmalonate), indium tris(dioctylmalonate), and indium tris(diethyl(methyl malonate)).

Examples of the magnesium chelate include magnesium bis(2,4-pentanedionate) and magnesium bis(ethyl acetoacetate).

Examples of the chromium chelate include chromium tris(2,4-pentanedionate) and chromium tris(ethyl acetoacetate).

Examples of the manganese chelate include manganese (II) bis(2,4-pentanedionate), manganese (II) bis(ethyl acetoacetate), manganese (III) tris(2,4-pentanedionate), and manganese (III) tris(ethyl acetoacetate).

Examples of the cobalt chelate include cobalt tris(2,4-pentanedionate) and cobalt tris(ethyl acetoacetate).

Examples of the nickel chelate include nickel bis(2,4-pentanedionate) and nickel bis(ethyl acetoacetate).

Examples of the copper chelate include copper bis(2,4-pentanedionate) and copper bis(ethyl acetoacetate).

Examples of the zinc chelate include zinc bis(2,4-pentanedionate) and zinc bis(ethyl acetoacetate).

Examples of the gallium chelate include gallium tris(2,4-pentanedionate) and gallium tris(ethyl acetoacetate).

Examples of the ruthenium chelate include ruthenium tris(2,4-pentanedionate) and ruthenium tris(ethyl acetoacetate).

Examples of the palladium chelate include palladium bis(2,4-pentanedionate) and palladium bis(ethyl acetoacetate).

Examples of the hafnium chelate include hafnium tetrakis (2,4-pentanedionate) and hafnium tetrakis(ethyl acetoacetate).

Examples of the platinum chelate include platinum bis(2, 4-pentanedionate) and platinum bis(ethyl acetoacetate).

Such a metal chelate can be obtained, for example, by the following method. A desired metal chelate can be synthesized by, after delivering a defined amount of ligand by drops into a metal alkoxide, distilling off the alkoxide-derived alcohol component through heating to reflux. In addition, a metal chelate having different ligands can be obtained by delivering two or more types of ligands in order by drops.

In the gate insulating layer, metal atoms are preferably contained to be 10 parts by mass or more and 180 parts by mass or less with respect to 100 parts by mass in total of carbon atoms and silicon atoms. This range improves the insulation characteristics. The mass ratio of metal atoms to 100 parts by mass in total of carbon atoms and silicon atoms in the insulating layer can be measured by X-ray photoelectron spectroscopy (XPS).

In the case of using a raw material composition containing an aluminum chelate, a polysiloxane, and a solvent and containing the polysiloxane at 5 parts by mass or more and 90 parts by mass or less with respect to 100 parts by mass of the aluminum chelate, an insulating layer is formed which contains, roughly, 10 parts by mass or more and 180 parts by mass or less of the aluminum atom with respect to 100 parts by mass of carbon atoms and silicon atoms in total.

It is to be noted that the above-described relation between the content ratios of the atoms in the composition and the insulating layer is just considered as a rough tendency, and for example, depending on the type of metal atom, or the like, the above-described relation is not always satisfied.

The film thickness of the gate insulating layer is preferably 0.05 µm or more and 5 µm or less, more preferably 0.1 µm or more and 1 µm or less. The film thickness in this range makes it easy to form a uniform thin film. Within the film thickness of 1 µm or less, scattering of the exposure light in the gate insulating layer is suppressed during processing of the conductive film by exposure from the rear surface of the substrate, and the processing accuracy of the conductive film is further improved. The film thickness can be measured by an atomic force microscope, an ellipsometric method, or the like.

The insulating layer may be composed of a single layer or multiple layers. In addition, one layer may be formed from multiple insulating materials, or multiple insulating layers may be formed by laminating multiple insulating materials.

<Upper Electrode>

The upper electrode is obtained by applying a photosensitive paste mainly containing a conductor and a photosensitive organic component to form the conductive film 4, and then carrying out patterning for the conductive film 4.

(Conductor)

As the conductor used for the upper electrode, any conductive material that can be used as an electrode may be used, and specifically, metal particles containing at least one metal selected from gold, silver, copper, platinum, lead, tin, nickel, aluminum, tungsten, molybdenum, ruthenium oxide, chromium, titanium, and indium, and carbon are preferred. These materials may be used alone, or used in mixture, or metal particles containing an alloy composed of the foregoing multiple metals may be used.

Among the foregoing materials, gold, silver, copper, or platinum particles are preferred from the viewpoint of conductivity. Among the particles, the silver particles are more preferred from the viewpoints of cost and stability. In addition, from the viewpoint of reducing the resistivity at the time of low-temperature curing of the coating film, it is more preferable to contain carbon black in addition to the metal particles.

The average particle size of the metal particles is preferably 0.02 µm or more and 10 µm or less, more preferably 0.02 µm or more and 5 µm or less, and still more preferably 0.02 µm or more and 2 µm or less. When the average particle size is 0.02 µm or more, the contact probability between the metal particles is improved, thereby making it possible to reduce the specific resistance value and disconnection probability of the electrode to be prepared. Furthermore, the active light beams at the time of exposure can smoothly pass through the film, thus facilitating fine patterning. In addition, when the average particle size is 10 µm or less, the surface smoothness, pattern accuracy, and dimensional accuracy of the electrode are improved.

It is to be noted that the average particle size of the metal particles is calculated by observing a cross section of the upper electrode at 10000-fold magnification with the use of a scanning electron microscope (SEM), measuring lengths of the particle sizes of 100 particles randomly selected from the obtained image, and averaging up the lengths. In a case in which the shape of the particle is spherical, the diameter is regarded as the particle size. In a case in which the shape is other than spherical, the average value for the maximum width and minimum width observed for one particle is regarded as the particle size of the particle.

The content of the conductor preferably falls within the range of 70% by mass or higher and 95% by mass or lower with respect to the total solid content in the photosensitive paste. The lower limit of the content is preferably 80% by mass or more. When the content is 70% by weight or higher, the contact probability between the particles is improved particularly in cure shrinkage at the time of curing, thereby making it possible to reduce the specific resistance value and disconnection probability of the electrode to be prepared. In addition, when the content is 95% by weight or lower, the active light beams at the time of exposure can smoothly pass through the film, thereby facilitating fine patterning. In addition, the solid content refers to the photosensitive paste with the solvent removed therefrom.

(Photosensitive Organic Component)

The photosensitive organic component preferably contains a monomer, an oligomer, or a polymer having a polymerizable unsaturated group in the molecule.

As the monomer having a polymerizable unsaturated group in the molecule, a compound having an active carbon-carbon unsaturated double bond can be used. Monofunctional and polyfunctional compounds having a vinyl group, an allyl group, an acrylate group, a methacrylate group, or an acrylamide group can be applied as the functional group.

Specific examples thereof include allylated cyclohexyl diacrylate, polyethylene glycol diacrylate, dipentaerythritol hexaacrylate, dipentaerythritol monohydroxypentaacrylate, ditrimethylolpropane tetraacrylate, glycerol diacrylate, methoxylated cyclohexyl diacrylate, neopentyl glycol diacrylate, propylene glycol diacrylate, polypropylene glycol diacrylate, triglycerol diacrylate, trimethylolpropane triacrylate, bisphenol A diacrylate, diacrylates of bisphenol A-ethylene oxide adducts, diacrylates of bisphenol A-propylene oxide adducts, 1,6-hexanediol diacrylate, tripropylene glycol diacrylate, 2-(2-ethoxyethoxy) ethyl acrylate, tetrahydrofurfuryl acrylate, lauryl acrylate, 2-phenoxyethyl acrylate, isodecyl acrylate, isooctyl acrylate, tridecyl acrylate, 1,3-butanediol diacrylate, 1,4-butanediol diacrylate, diethylene glycol diacrylate, tetraethylene glycol diacrylate, triethylene glycol diacrylate, or compounds obtained by partially or entirely replacing the acrylic groups of the compounds mentioned above for methacrylic group.

According to the present invention, one of, or two or more of the foregoing examples can be used. The content of the monomer preferably falls within the range of 1% by mass or higher and 15% by mass or lower, more preferably the range of 1% by mass or higher and 10% by mass or lower with respect to the total solid content in the photosensitive paste.

The oligomer or polymer having a polymerizable unsaturated group in the molecule is obtained by polymerization or copolymerization of a component selected from compounds having a carbon-carbon double bond. The addition of a photoreactive group to a side chain or a molecular terminal to such an oligomer or polymer makes it possible to obtain an oligomer or a polymer having a polymerizable unsaturated group in the molecule.

Preferred polymerizable unsaturated groups have an ethylenically unsaturated group. Examples of the ethylenically unsaturated group include a vinyl group, an allyl group, an acryl group, and a methacryl group.

Examples of the method of adding such a side chain to an oligomer or a polymer include a method of developing a reaction of adding an ethylenically unsaturated compound having a glycidyl group or an isocyanate group, or an acrylic acid chloride, a methacrylic acid chloride, or an allyl chloride to a mercapto group, an amino group, a hydroxyl group, or a carboxyl group in an oligomer or a polymer.

Examples of the ethylenically unsaturated compound having a glycidyl group include glycidyl acrylate, glycidyl methacrylate, allyl glycidyl ether, glycidyl ethyl acrylate, crotonyl glycidyl ether, crotonic acid glycidyl ether, and isocrotonic acid glycidyl ether. Examples of the ethylenically unsaturated compound having an isocyanate group include (meth)acryloyl isocyanate and (meth)acryloylethyl isocyanate. In addition, the ethylenically unsaturated compound having a glycidyl group or an isocyanate group, acrylic chloride, methacrylic chloride, or allyl chloride is preferably added to be equivalent to 0.05 to 1 mol with respect to the mercapto group, amino group, hydroxyl group, or carboxyl group in the oligomer or the polymer.

From the viewpoint of further enhancing the adhesion between the upper electrode and the gate insulating layer, the photosensitive organic component preferably contains a compound having a urethane group. For example, the oligomer or polymer preferably contains a urethane-modified compound obtained by reacting an oligomer or a polymer having a hydroxyl group in a side chain with a compound having an isocyanate group.

Such an oligomer or polymer having a polymerizable unsaturated group in the molecule preferably has a weight average molecular weight (Mw) within the range of 2,000 or more and 200,000 or less, and a number average molecular weight (Mn) within the range of 1,000 or more and 50,000 or less, and more preferably, Mw falls within the range of 5000 or more and 100000 or less, and Mn falls within the range of 1000 or more and 30,000 or less. The Mw and Mn within the ranges mentioned above can provide a favorable handling property, and a uniform curing property at the time of light curing.

In a case in which the photosensitive organic component contains a monomer, oligomer, or polymer having a polymerizable unsaturated group in the molecule, these components have no ability to absorb the energy of active light beams, and thus, in order to carry out light curing, it is necessary to use a photopolymerization initiator. The photopolymerization initiator is selected depending on the light source used for the light curing, and a radical photopolymerization initiator, a cationic photopolymerization initiator, or the like can be used.

Examples of the radical photopolymerization initiator include diethoxyacetophenone, 2-hydroxy-2-methyl-1-phenylpropan-1-one, benzyl dimethyl ketal, 1-(4-isopropylphenyl)-2-hydroxy-2-methylpropane-1-on, 4-(2-hydroxyethoxy)phenyl-(2-hydroxy-2-propyl)ketone, 1-hydroxycyclohexyl-phenyl ketone, 1-phenyl-1,2-propanedione-2-(o-ethoxycarbonyl)oxime, 2-methyl-[4-(methylthio)phenyl]-2-morpholinopropane-1-one, 2-benzyl-2-dimethylamino-1-(4-morpholinophenyl)-butanone-1, benzoin, benzoin methyl ether, benzoin ethyl ether, benzoin isopropyl ether, benzoin isobutyl ether, benzophenone, methyl o-benzoylbenzoate, 4-phenylbenzophenone, 4,4-dichlorobenzophenone, hydroxybenzophenone, 4-benzoyl-4'-methyl-diphenylsulfide, alkylated benzophenone, 3,3',4,4'-tetra(t-butylperoxycarbonyl)benzophenone, 4-benzoyl-N,N-dimethyl-N-[2-(1-oxo-2-propenyloxy)ethyl] dimethylbenzenemethanaminium bromide, (4-benzoylbenzyl)trimethylammonium chloride, 2-hydroxy-3-(4-benzoylphenoxy)-N,N,N-trimethyl-1-propenealuminum chloride monohydrate, 2-isopropylthioxanthone, 2,4-dimethylthioxanthone, 2,4-diethylthioxanthone, 2,4-dichlorothioxanthone, 2-hydroxy-3-(3,4-dimethyl-9-oxo-9H-thioxanthen-2-yloxy)-N,N,N-trimethyl-1-propanaminium chloride, 2,4,6-trimethylbenzoylphenyl phosphine oxide, 2,2'-bis(o-chlorophenyl)-4,5,4',5'-tetraphenyl-1,2-biimidazole, 10-butyl-2-chloroacridone, 2-ethylanthraquinone, benzyl, 9,10-phenanthrenequinone, camphorquinone, methylphenylglyoxy ester, η5-cyclopentadienyl-η6-cumenyl-iron (1+)-hexafluorophosphate(1-), diphenyl sulfide derivatives, bis(η5-2,4-cyclopentadiene-1-yl)-bis(2,6-difluoro-3-(1H-pyrrol-1-yl)-phenyl) titanium, 4,4-bis(dimethylamino)benzophenone, 4,4-bis(diethylamino)benzophenone, thioxanthone, 2-methylthioxanthone, 2-chlorothioxanthone, 4-benzoyl-4-methylphenylketone, dibenzylketone, fluorenone, 2,3-diethoxyacetophenone, 2,2-dimethoxy-2-phenyl-2-phenylacetophenone, 2-hydroxy-2-methylpropiophenone, p-t-butyldichloroacetophenone, benzylmethoxyethyl acetal, anthraquinone, 2-t-butylanthraquinone, 2-aminoanthraquinone, β-chloroanthraquinone, anthrone, benzanthrone, dibenzanthrone, methyleneanthrone, 4-azidobenzalacetophenone, 2,6-bis(p-azidobenzylidene)cyclohexane, 2,6-bis(p-azidobenzylidene)-4-methylcyclohexanone, 2-phenyl-1,2-butadione-2-(o-methoxycarbonyl) oxime, 1,3-diphenylpropanetrione-2-(o-ethoxycarbonyl) oxime, N-phenylglycine, tetrabutylammonium(+1)n-butyltriphenyl borate(1-), naphthalenesulfonyl chloride, quinolinesulfonyl chloride, N-phenylthioacridone, 4,4-azobisisobutyronitrile, benzthiazole disulfide, triphenylphosphine, tetrabrominated carbon, tribromophenylsulfone, benzoyl peroxide, and a combination of a photoreducing pigment such as eosin or methylene blue and a reducing agent such as ascorbic acid and triethanolamine, a complex of a cationic dye which absorbs near ultraviolet and a borate anion, a combination of a silver halide sensitized with a near-infrared sensitizing dye and a reducing agent, and at least one of radical generating agents such as titanocene, an iron arene complex, organic peroxide, hexaaryl, biimidazole, N-phenylglycine, and a diaryliodonium salt, and furthermore, if necessary, a sensitizing dye such as 3-substituted Coumarin, a cyanine dye, a merocyanine dye, a thiazole-based dye, and a pyrylium dye.

Examples of the cationic photopolymerization initiator include an iodonium salt, a sulfonium salt, a phosphate salt, and an antimonate salt.

According to the present invention, one of, or two or more of the foregoing examples can be used. The content of the photopolymerization initiator is preferably 0.05% by mass or higher and 10% by mass or lower, more preferably 0.1% by mass or higher and 10% by mass or lower, with respect to the conductive paste.

The use of a sensitizer together with the photopolymerization initiator can improve the sensitivity, and expand the wavelength range which is effective for the reaction.

Specific examples of the sensitizer include 2,3-bis(4-diethylaminobenzal)cyclopentanone, 2,6-bis(4-dimethylaminobenzal)cyclohexanone, 2,6-bis(4-dimethylaminobenzal)-4-methylcyclohexanone, 4,4-bis(dimethylamino) chalcone, 4,4-bis(diethylamino)chalcone, p-dimethylaminocinnamylidene indanone, p-dimethylaminobenzylidene indanone, 2-(p-dimethylaminophenylvinylene)isonaphthothiazole, 1,3-bis(4-dimethylaminophenylvinylene)isonaphthothiazole, 1,3-bis(4-dimethylaminobenzal)acetone, 1,3-carbonylbis(4-diethylaminobenzal)acetone, 3,3-carbonylbis(7-diethylaminocoumarin), triethanolamine, methyldiethanolamine, triisopropanolamine, N-phenyl-N-ethyl ethanolamine, N-phenyl ethanolamine, N-tolyl diethanolamine, methyl 4-dimethylaminobenzoate, ethyl 4-dimethylaminobenzoate, isoamyl dimethylaminobenzoate, isoamyl diethylaminobenzoate, (2-dimethylamino)ethyl benzoate, (n-butoxy)ethyl 4-dimethylaminobenzoate, 2-ethylhexyl 4-dimethylaminobenzoate, 3-phenyl-5-benzoylthiotetrazole, and 1-phenyl-5-ethoxycarbonylthiotetrazole.

In the photosensitive paste used for the present invention, one of, or two or more of the foregoing examples can be used. In the case of adding a sensitizer to the photosensitive paste according to the present invention, the content of the sensitizer is preferably 0.05% by mass or higher and 10% by mass or lower, more preferably 0.1% by mass or higher and 10% by mass or lower, with respect to the photosensitive organic component.

The photosensitive paste used for the present invention preferably contains an organic solvent. The use of an organic solvent can adjust the viscosity of the photosensitive paste, and improve the surface smoothness of the coating film.

For example, in the case of forming the coating film by screen printing, the viscosity of the photosensitive paste is preferably from 10 Pa's or higher and 100 Pa's or lower, more preferably 10 Pa s or higher and 50 Pa s or lower. It is to be noted that the viscosity has a value measured at 3 rpm with the use of a Brookfield-type viscometer. The viscosity of the photosensitive paste falls within the range mentioned above, thereby making the coverage favorable even in a case there is any step. On the other hand, in the case of forming the coating film by an ink-jet technique, the viscosity of the photosensitive paste is preferably from 0.1 mPa·s or higher and 100 mPa·s or lower, more preferably 1 mPa·s or higher and 50 mPa·s or lower. The viscosity of the photosensitive paste falls within the range mentioned above, thereby allowing favorable droplet formation, and thus providing a uniform coating film.

The organic solvent is not to be considered particularly limited, and examples thereof include methyl ethyl ketone, dioxane, acetone, cyclohexanone, cyclopentanone, isobutyl alcohol, isopropyl alcohol, tetrahydrofuran, γ-butyrolactone, bromobenzene, chlorobenzene, dibromobenzene, dichlorobenzene, bromobenzoic acid, chlorobenzoic acid and the like, diethylene glycol monoethyl ether acetate, diethylene glycol monobutyl ether, diethylene glycol monobutyl ether acetate, 2-methyl-2,4-pentanediol, 3-methyl-1,5-pentanediol, 2-ethyl-1,3-hexanediol, terpineol, 3-methyl-3-methoxybutanol, texanol, benzyl alcohol, dipropylene glycol monoethyl ether, tripropylene glycol monomethyl ether, and propylene glycol monomethyl ether acetate. Two or more of the foregoing examples may be used in mixture.

The photosensitive paste used for the present invention can be also blended with additives such as a non-photosensitive polymer having no unsaturated double bond in the molecule, a plasticizer, a leveling agent, a surfactant, a silane coupling agent, an antifoaming agent, and a pigment, as long as the desired characteristics of the photosensitive paste are not damaged. Specific examples of the non-photosensitive polymer include epoxy resins, novolac resins, phenol resins, polyimide precursors, and polyimide.

Specific examples of the plasticizer include dibutyl phthalate, dioctyl phthalate, polyethylene glycol, and glycerin. Specific examples of the leveling agent include a special vinyl polymer and a special acrylic polymer.

Examples of the silane coupling agent include methyltrimethoxysilane, dimethyldiethoxysilane, phenyltriethoxysilane, hexamethyldisilazane, 3-methacryloxypropyltrimethoxysilane, 3-glycidoxypropyltrimethoxysilane, and vinyltrimethoxysilane.

The photosensitive paste used for the present invention is prepared through the use of a disperser, a kneader, or the like. Specific examples thereof include, but not limited to, a triple roller, a ball mill, and a planetary ball mill.

(Upper Electrode)

The upper electrode has arbitrary width and thickness. From the viewpoint of ease of forming the electrode pattern, the electrode width is preferably, but not limited to, 10 μm or more and 10 mm or less, and the thickness is preferably, but not limited to, 0.01 μm or more and 100 μm or less.

The material of the wiring for the upper electrode is the same as the wiring material for the lower electrode.

<Semiconductor Layer>

The material used for the semiconductor layer is not particularly limited as long as the material is a material that exhibits a semiconductor property, and a material which is high in carrier mobility is preferably used. Also, materials are preferred to which a simple and low-cost coating process is applied, and preferred examples include organic semiconductors and carbon materials.

Specific examples of the organic semiconductor include:
a compound including, in the main chain, a thiophene unit such as polythiophenes, e.g., poly-3-hexylthiophene and polybenzothiopehene, poly(2,5-bis(2-thienyl)-3,6-dipentadecylthieno[3,2-b] thiophene), poly(4,8-dihexyl-2,6-bis(3-hexylthiophene-2-yl)benzo[1,2-b:4,5-b']dithiophene), poly (4-octyl-2-(3-octylthiophene-2-yl)thiazole), poly(5,5'-bis(4-octylthiazol-2-yl)-2,2'-bithiophene);

polypyrroles, poly(p-phenylenevinylenes) such as poly(p-phenylenevinylene), polyanilines, polyacetylenes, polydiacetylenes, polycarbazoles, polyfurans such as polyfuran and polybenzofuran;

polyheteroaryls having a nitrogen-containing aromatic ring as a constitutional unit such as pyridine, quinoline, phenanthroline, oxazole, and oxadiazole;

condensed polycyclic aromatic compounds such as anthracene, pyrene, naphthacene, pentacene, hexacene, and rubrene;

heteroaromatic compounds such as furan, thiophene, benzothiophene, dibenzofuran, pyridine, quinoline, phenanthroline, oxazole, and oxadiazole;

aromatic amine derivatives represented by 4,4'-bis(N-(3-methylphenyl)-N-phenylamino)biphenyl;

biscarbazole derivatives such as bis(N-allylcarbazole) or bis(N-alkylcarbazole);

pyrazoline derivatives, stilbene compounds, and hydrazone compounds;

metal phthalocyanines such as copper phthalocyanine; metal porphyrins such as copper porphyrin;

distyrylbenzene derivatives, aminostyryl derivatives, and aromatic acetylene derivatives;

condensed ring tetracarboxylic acid diimides such as naphthalene-1,4,5,8-tetracarboxylic acid diimide, and perylene-3,4,9,10-tetracarboxylic acid diimide; and organic pigments such as merocyanine, phenoxazine, and rhodamine. Two or more of the foregoing examples may be contained.

Examples of the carbon material include a carbon nanotube (hereinafter, referred to as a CNT), graphene, and fullerene, and the CNT is preferred in terms of suitability for coating processes and high mobility.

As the CNT, any of a single-walled CNT of a single carbon film (graphene sheet) wound in a cylindrical shape, a double layer CNT of two graphene sheets wound concentrically, and a multilayer CNT of multiple graphene sheets wound concentrically, may be used, or two or more thereof may be used. From the viewpoint of exhibiting semiconductor characteristics, it is preferable to use the single-walled CNT, and above all, the single-walled CNT more preferably contains 90% by weight or higher of highly semiconductor enriched single-walled CNT. Still more preferably, the single-walled CNT contains 95% by weight or higher of highly semiconductor enriched single-walled CNT.

The content ratio of the highly semiconductor enriched single-walled CNT can be calculated from the absorption area ratio of a visible-near infrared absorption spectrum. The CNT can be obtained by a method such as an arc-discharge method, a chemical vapor deposition method (CVD method), or a laser ablation method.

Among the foregoing materials, from the ease of forming the semiconductor layer, the material used for the semiconductor layer is preferably a CNT. Furthermore, CNT (hereinafter referred to as CNT composite) having a conjugated polymer attached to at least a part of its surface is particularly preferable because it has excellent dispersion stability in solution and high mobility can be obtained. In this regard, the conjugated polymer refers to a compound where the repeating unit has a conjugated structure, and the degree of polymerization is 2 or more.

The conjugated polymer attached to at least a part of the surface of the CNT means that the CNT surface is partially or entirely coated with the conjugated polymer. It is presumed that the reason why the conjugated polymer can coat CNT is that interaction produced by overlaps between $\pi$ electron clouds derived from the respective conjugated structures. Whether the CNT is coated with the conjugated polymer or not can be determined from the fact that the reflected color of the coated CNT is brought close to the color of the conjugated polymer from the color of the uncoated CNT. Quantitatively, the presence of a deposit and the mass ratio of the deposit to CNT can be identified by elemental analysis such as X-ray photoelectron spectroscopy (XPS).

The conjugated polymer attached to the CNT can be used regardless of the molecular weight, the molecular weight distribution, and the structure. From the viewpoint of adhesion to the CNT, the conjugated polymer preferably has a weight average molecular weight of 1000 or more.

The CNT composite, with the conjugated polymer attached to at least a part of the surface of the CNT makes it possible to disperse CNT uniformly in the solution without damage to the great electrical characteristics possessed by the CNT. In addition, the adoption of a coating method with the use of a dispersion in which CNTs are uniformly dispersed makes it possible to form a uniformly dispersed CNT film. Thus, great semiconductor characteristics can be achieved.

Examples of the method for attaching the conjugated polymer to the CNT include: (I) a method of adding and mixing the CNT to and with the melted conjugated polymer; (II) a method of dissolving the conjugated polymer in a solvent, and adding and mixing the CNT to and with the solvent; (III) a method of adding and mixing the conjugated polymer to and with CNTs dispersed in a solvent in advance with ultrasonic waves or the like; and (IV) a method of putting the conjugated polymer and the CNT in a solvent, and irradiating the mixed system with ultrasonic waves for mixing the system. According to the present invention, multiple methods may be combined.

According to the present invention, the length of the CNT is preferably shorter than the distance (channel length) between the source electrode and the drain electrode. The average length of the CNT depends on the channel length, but is preferably 2 µm or less, more preferably 0.5 µm or less. In general, commercially available CNTs have a distribution in length, and may include CNTs which are longer than the channel length, and it is thus preferable to add a step of making the CNTs shorter than the channel length. For example, a method is effective in which cutting into short fibers is carried out by acid treatment with a nitric acid, a sulfuric acid, or the like, ultrasonic treatment, a freeze pulverization method, or the like. In addition, it is further preferable to combine separation through a filter in terms of improvement in purity.

In addition, the diameter of the CNT is not particularly limited, but preferably 1 nm or more and 100 nm or less, and more preferably 50 nm or less.

According to the present invention, it is preferable to provide a step of uniformly dispersing the CNT in a solvent and filtering the dispersion through a filter. The CNT which is shorter than the channel length can be efficiently obtained by obtaining, from the filtrate, a CNT that is smaller than the filter pore size. In this case, a membrane filter is preferably used as the filter. The pore size of the filter used for the filtration has only to be smaller than the channel length.

Examples of the conjugated polymer that coats the CNT mentioned above include a polythiophene polymer, a polypyrrole polymer, a polyaniline polymer, a polyacetylene polymer, a poly-p-phenylene polymer, a poly-p-phenylene vinylene polymer, and a thiophene-heteroarylene polymer having a thiophene unit and a heteroaryl unit in a repeating unit, and two or more of these examples may be used. As the polymer mentioned above, an arrangement of single monomer units, a block copolymer, a random copolymer, or a graft polymer of different monomer units, and the like can be used.

In addition, for the semiconductor layer, a CNT composite and an organic semiconductor may be used in mixture. The CNT composite is uniformly dispersed in the organic semiconductor, thereby making it possible to achieve a high mobility while maintaining the characteristics of the organic semiconductor itself.

The content of the CNT composite in the semiconductor layer including the CNT composite and the organic semiconductor is preferably 0.01 parts by weight or more and 3 parts by weight or less, and more preferably 1 part by weight or less, with respect to 100 parts by weight of the organic semiconductor.

The semiconductor layer may further include an insulating material. Examples of the insulating material used herein include the insulating material composition according to the present invention, and polymer materials such as poly(methyl methacrylate), polycarbonate, and polyethylene terephthalate, but the insulating material is not particularly limited thereto.

The semiconductor layer 7 may be composed of a single layer or multiple layers, and the film thickness thereof is preferably 1 nm or more and 200 nm or less, more preferably 100 nm or less. The film thickness in this range makes it easy to form a uniform thin film, and further makes it possible to suppress the source-drain current which fails to be controlled by the gate voltage, thereby further increasing the on/off ratio of the FET. The film thickness can be measured by an atomic force microscope, an ellipsometric method, or the like.

In addition, an orientation layer can be also provided between the gate insulating layer and the semiconductor layer. For the orientation layer, known materials can be used, such as a silane compound, a titanium compound, and an organic acid, and a heteroorganic acid, and in particular, an organic silane compound is preferred.

Specific examples of the organosilane compound include, but are not limited to, phenyltrichlorosilane, naphthyltrichlorosilane, anthryltrichlorosilane, pyrenyltrichlorosilane, perylenyltrichlorosilane, coronenyltrichlorosilane, thiophenyltrichlorosilane, pyrrolyltrichlorosilane, pyridyltrichlorosilane, phenyltrimethoxysilane, phenyltriethoxysilane, naphthyltrimethoxysilane, naphthyltriethoxysilane, anthracenetrimethoxysilane, anthryltriethoxysilane, pyrenyltrimethoxysilane, pyrenyltriethoxysilane, thiophenyltrimethoxysilane, thiophenyltriethoxysilane, phenylmethyltrichlorosilane, phenylethyltrichlorosilane, phenylpropyltrichlorosilane, phenylbutyltrichlorosilane, phenylhexyltrichlorosilane, phenyloctyltrichlorosilane, naphthylmethyltrichlorosilane, naphthylethyltrichlorosilane, anthrylmethyltrichlorosilane, anthryllethyltrichlorosilane, pyrenylmethyltrichlorosilane, pyrenylethyltrichlorosilane, thiophenylmethyltrichlorosilane, thiophenylethyltrichlorosilane, aminophenyltrichlorosilane, hydroxyphenyltrichlorosilane, chlorophenyltrichlorosilane, dichlorophenyltrichlorosilane, trichlorophenyltrichlorosilane, bromophenyltrichlorosilane, fluorophenyltrichlorosilane, difluorophenyltrichlorosilane, trifluorophenyltrichlorosilane, tetrafluorophenyltrichlorosilane, pentafluorophenyltrichlorosilane, iodophenyltrichlorosilane, and cyanophenyltrichlorosilane.

The orientation layer is preferably formed of a monomolecular layer or a molecular assembly containing the organic silane compound, but in consideration of the resistance of the orientation layer, the orientation layer is preferably 10 nm or less in film thickness, more preferably a monomolecular film. In addition, examples of the orienting layer containing the silane compound also include an orientation layer formed with a chemical bond between a functional group in the silane compound and the surface of the gate insulating layer. The functional group (for example, a trichlorosilyl group) chemically reacts with the surface of the gate insulating layer, thereby making it possible to form a dense and strong film. In a case in which an unreacted silane compound is laminated on the strong film after the reaction, the unreacted silane compound is removed by washing or the like, thereby making it possible to obtain a monomolecular film formed by making a chemical bond between the functional group and the surface of the gate insulating layer.

Examples of the method for forming the oriented layer include, but not particularly limited thereto, vapor phase methods such as a CVD method, and methods that uses a liquid phase, such as a spin coating method and an immersion and withdrawal method.

Prior to the formation of the orientation layer, the surface of the underlying gate insulating layer may be subjected to a treatment for hydrophilicity by using a method such as a UV ozone method or an oxygen plasma method. This treatment makes it possible to facilitate the chemical reaction between the functional group and the surface of the gate insulating layer.

According to the present invention, a second insulating layer may be formed on the side opposite to the gate insulating layer with respect to the semiconductor layer. This second insulating layer can protect the semiconductor layer from external environments such as oxygen and moisture.

Specific examples of the material used for the second insulating layer include, but not particularly limited to, an inorganic material such as silicon oxide and alumina, a polymer material such as polyimide and derivatives thereof, polyvinyl alcohol, polyvinyl chloride, polyethylene terephthalate, polyvinylidene fluoride, polysiloxane and derivatives thereof, and polyvinyl phenol and derivatives thereof, or a mixture of an inorganic material powder and a polymer material, and a mixture of an organic low molecular weight material and a polymer material.

Among the foregoing examples, it is preferable to use the polymer material that can be prepared by a coating method such as an ink-jet technique. In particular, the use of polyfluoroethylene, polynorbornene, polysiloxane, polyimide, polystyrene, polycarbonate, or a derivative thereof, a polyacrylic acid derivative, a polymethacrylic acid derivative, or a copolymer containing the foregoing material is preferred from the viewpoint of the uniformity of the insulating layer.

The film thickness of the second insulating layer is preferably 50 nm or more and 10 μm or less, and more preferably 100 nm or more and 3 μm or less. The second insulating layer may be composed of a single layer or multiple layers. In addition, one layer may be formed from multiple insulating materials, or formed by laminating multiple insulating materials.

The method for forming the second insulating layer is not particularly limited, and it is also possible to use dry methods such as resistance heating evaporation, electron beams, sputtering, and CVD, but from the viewpoint of manufacturing cost and adaptability to large areas, it is preferable to use a coating method. As the coating method, specifically, a spin coating method, a blade coating method, a slit die coating method, a screen printing method, a bar coater method, a casting method, a transfer printing method, an immersion and withdrawal method, an ink-jet method, a drop cast method, and the like can be preferably used. The coating method can be selected depending on coating film properties to be obtained, such as coating film thickness control and orientation control.

The solvent for dissolving the insulating material used for the second insulating layer in forming the second insulating layer by using the coating method is not particularly limited, but examples of the solvent include:

ethers such as ethylene glycol monomethyl ether, ethylene glycol monoethyl ether, propylene glycol monomethyl ether, propylene glycol monoethyl ether, propylene glycol mono n-butyl ether, propylene glycol mono t-butyl ether, ethylene glycol dimethyl ether, ethylene glycol diethyl ether, ethylene glycol dibutyl ether, and diethylene glycol ethyl methyl ether;

esters such as ethylene glycol monoethyl ether acetate, propylene glycol monomethyl ether acetate, propyl acetate, butyl acetate, isobutyl acetate, 3-methoxybutyl acetate, 3-methyl-3-methoxybutyl acetate, methyl lactate, ethyl lactate, and butyl lactate;

ketones such as acetone, methyl ethyl ketone, methyl propyl ketone, methyl butyl ketone, methyl isobutyl ketone, cyclopentanone, and 2-heptanone;

alcohols such as butyl alcohol, isobutyl alcohol, pentanol, 4-methyl-2-pentanol, 3-methyl-2-butanol, 3-methyl-3-methoxybutanol, and diacetone alcohol; and aromatic hydrocarbons such as toluene and xylene. Two or more of the foregoing examples may be used.

Above all, it is preferable to contain a solvent that has a boiling point of 110° C. or higher and 200° C. or lower at 1 atmosphere. As long as the boiling point is 110° C. or higher, the volatilization of the solvent is suppressed at the time of applying the solution, thereby providing favorable coatability. As long as the boiling point is 200° C. or lower, an insulating layer can be obtained which has a small amount of solvent remaining therein and has more favorable heat resistance and chemical resistance. In addition, the formed coating film may be subjected to an annealing treatment under the atmosphere, under reduced pressure, or under an inert gas atmosphere such as nitrogen or argon.

The formed FET can control the current flowing between the source electrode and the drain electrode by changing the gate voltage. The mobility as an index of FET performance can be calculated with the use of the following formula (a).

$$\mu = (\delta Id/\delta Vg) L \cdot D / (W \cdot \varepsilon r \cdot \varepsilon \cdot Vsd) \quad (a)$$

where Id represents the current between the source and the drain, Vsd represents the voltage between the source and the drain, Vg represents the gate voltage, D represents the thickness of the gate insulating layer, L represents the channel length, W represents the channel width, εr represents the relative dielectric constant of the gate insulating layer, ε represents the permittivity of vacuum ($8.85 \times 10^{-12}$ F/m).

The FET formed by the method mentioned above serves as an FET which has a high mobility, and has a relative position controlled with a high degree of accuracy between the gate electrode and the source and drain electrodes.

<Wireless Communication Device>

Next, a method for manufacturing a wireless communication device containing the FET obtained by the method mentioned above will be described. This method includes a step of forming a field-effect transistor by the manufacturing method mentioned above, and a step of forming an antenna pattern on the surface of the substrate on which the field effect transistor is formed. The order of forming the field-effect transistor and the antenna pattern is not restricted. It is to be noted that according to the present invention, an antenna is intended to transmit and receive radio waves.

The wireless communication device is a device that performs telecommunication in a way that an RFID tag receives a carrier wave transmitted from an antenna mounted on an external reader/writer, such as RFID, for example.

As a specific operation, for example, an antenna of the RFID tag receives a radio signal transmitted from the antenna mounted on the reader/writer, and the FET in the RFID operates in response to the command of the radio signal. Thereafter, a reply as a result in response to the command is transmitted as a radio signal from the antenna of the RFID tag to the antenna of the reader/writer. It is to be noted that the operation in response to the command is performed by a known demodulation circuit, a control logic circuit, a modulation circuit or the like composed of FETs.

Figure 4:
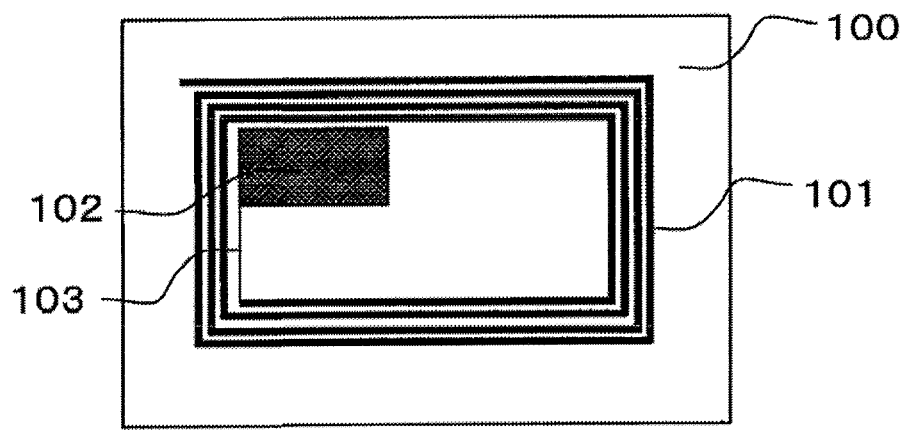
FIG. 4 is a schematic diagram of a wireless communication device formed by a method for manufacturing a wireless communication device according to an embodiment of the present invention.
Figure 5:
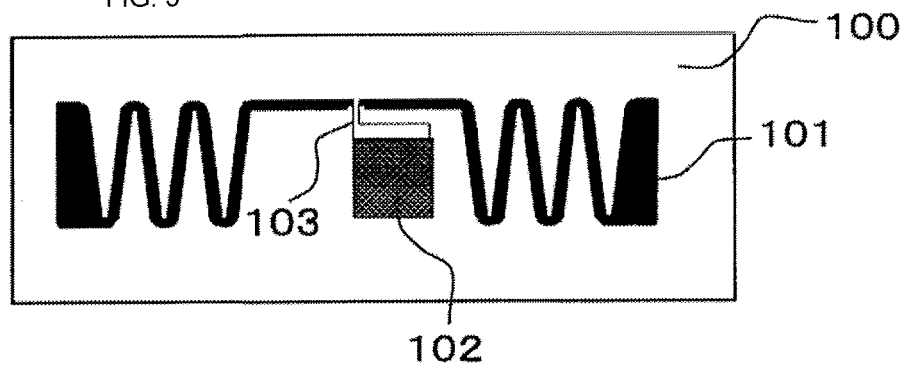
FIG. 5 is a schematic diagram of a wireless communication device formed by a method for manufacturing a wireless communication device according to an embodiment of the present invention.

As shown in FIGS. 4 and 5 by way of example, the wireless communication device can be manufactured by forming, on a substrate 100 with an antenna pattern 101 formed, a circuit 102 including the FET manufactured by the method for manufacturing the FET according to the present invention, and a connection wiring 103 for the circuit 102 and the antenna.

The antenna material and the connection wiring material may be any of conductive materials. Specific examples of the materials include, the same material as the lower electrode material. Above all, a paste material containing a conductor and a binder is preferred in terms of increased flexibility, and good adhesion, thus favorable electrical connection even at the time of bending. The antenna material and the connection wiring material are preferably made of the same material from the viewpoint of reducing the manufacturing cost.

Examples of the method for forming the antenna pattern and the connection wiring pattern include: a method of processing a metal foil such as a copper foil or an aluminum foil with the use of a punching blade and transferring the foil to the substrate, a method of etching a metal foil attached to the substrate, with a resist layer formed on the metal foil as a mask, a method of forming a pattern of a conductive paste on the substrate by a coating method, and curing the pattern by heat or light. Among the methods, the method of forming the patterns by applying the conductive paste to the substrate is preferred from the viewpoint of reducing the manufacturing cost.

Examples of the method of formation by the application include an ink-jet method, a printing method, an ion plating coating method, a resistance heating evaporation method, an electron beam method, a sputtering method, a plating method, and a CVD method.

In addition, the examples also include, in a case in which a paste containing a conductor and a binder is used as a material, a method of applying the paste through the use of a known technique such as a spin coating method, a blade coating method, a slit die coating method, a screen printing method, a bar coater method, a casting method, a transfer printing method, and an immersion and withdrawal method, and drying the paste with the use of an oven, a hot plate, infrared rays, or the like. In addition, the conductive film prepared by the method mentioned above may be subjected to patterning into a desired shape by a known photolithography method or the like, or subjected to patterning through a mask in a desired shape at the time of vapor deposition or sputtering.

Furthermore, the antenna pattern and the connection wiring pattern are preferably composed of the same material as the lower electrode and wiring of the FET. This is because with the reduced number of materials, the antenna pattern and the connection wiring pattern, and the lower electrode and wiring of the FET are prepared in the same step, thereby allowing the number of manufacturing steps and the cost to be reduced.

The fact that the antenna pattern and the connection wiring pattern, and the lower electrode and wiring of the FET are composed of the same material means that the same element has the highest molar content ratio among the elements included in the antenna pattern and the connection wiring pattern and the lower electrode and wiring of the FET. The types and content ratios of the elements in the antenna pattern and the connection wiring pattern and in the lower electrode and wiring of the FET can be identified by elemental analysis such as X-ray photoelectron spectroscopy (XPS) and secondary ion mass spectrometry (SIMS).

When the antenna pattern, the connection wiring pattern, and the lower electrode and wiring of the FET are prepared in the same step, the connection between the antenna pattern and the connection wiring pattern, and the connection between the connection wiring pattern and the wiring for the lower electrode of the FET are formed from a continuous phase. From the viewpoints of the adhesion of the antenna pattern, the connection wiring pattern, and the lower electrode and wiring of the FET, and the reduction of the manufacturing cost, it is preferable to form the connections so as to constitute a continuous phase. The fact that the antenna pattern, the connection wiring pattern, the lower electrode of the FET and the wiring pattern constitute a continuous phase means that these patterns are integrated without any connection interface at the connections. The fact that the connections constitute a continuous phase can be confirmed by observing cross sections of the connections with a scanning electron microscope (SEM), a transmission electron microscope (TEM), or the like.

The connection between the antenna pattern and the connection wiring pattern, and the connection between the connection wiring pattern and the wiring for the lower electrode of the FET may have any width and any thickness.

EXAMPLES

Hereinafter, the present invention will be described more specifically with reference to examples. It should be noted that the present invention is not to be considered limited to the following examples. Each evaluation method in the examples will be described in the following [1] to [5].

[1] Adhesion Evaluation

Figure 6:
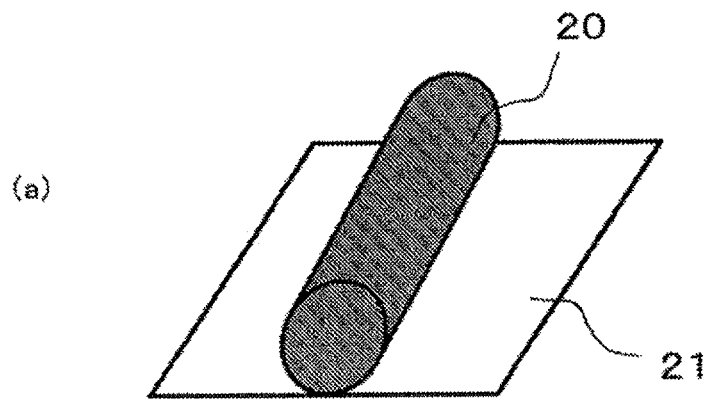
FIG. 6 is a schematic perspective view for explaining a method for evaluating bending resistance.
Figure 6:
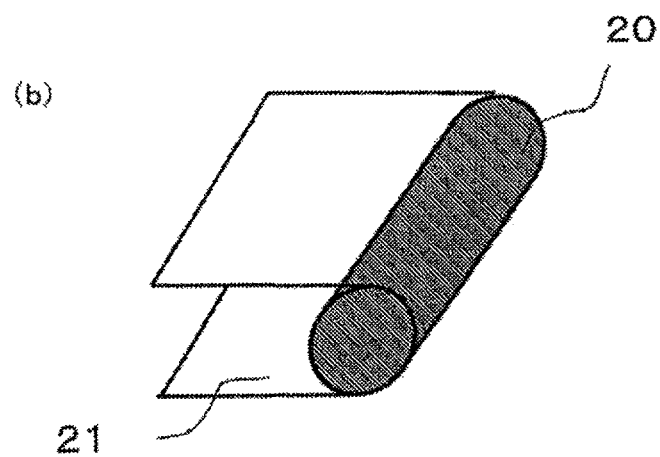

The evaluation will be described with reference to FIG. 6. With respect to the substrate 21 with the FET formed, a metal cylinder 20 of 30 mm in diameter was fixed to a central part on the surface with the FET formed, and placed at a holding angle 0° with respect to the cylinder (with the sample kept flat) along the cylinder (see FIG. 6 (a)), and a folding operation was carried out until the holding angle reaches 180° with respect to the cylinder (the sample folded back at the cylinder) (see FIG. 6 (b)). As for the bending resistance, the lower electrode, upper electrode, and antenna pattern of the FET before and after the bending operation were observed with an optical microscope, and evaluated in accordance with the following criteria.

A (good): Even when the bending operation is repeated 500 times, the lower electrode, the upper electrode, and the antenna pattern are not found to be peeled or chipped.

B (pass): Even when the bending operation is repeated 100 times, the lower electrode, the upper electrode, and the antenna pattern are not found to be peeled or chipped.

C (failure): When the bending operation is repeated less than 100 times, the lower electrode, the upper electrode, and the antenna pattern are at least partially found to be peeled and chipped.

Figure 7:
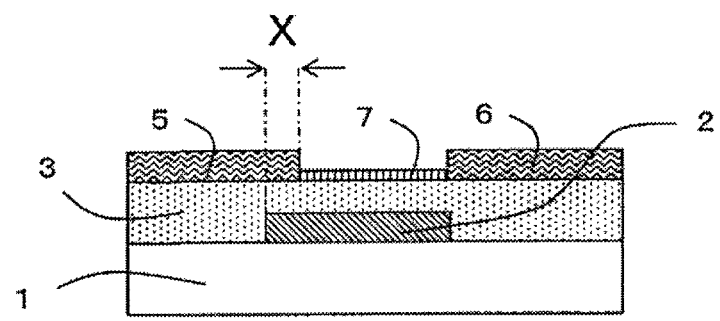
FIG. 7 is a cross-sectional view for explaining a method for evaluating a positional deviation between a gate electrode and a source/drain electrode.
Figure 8:
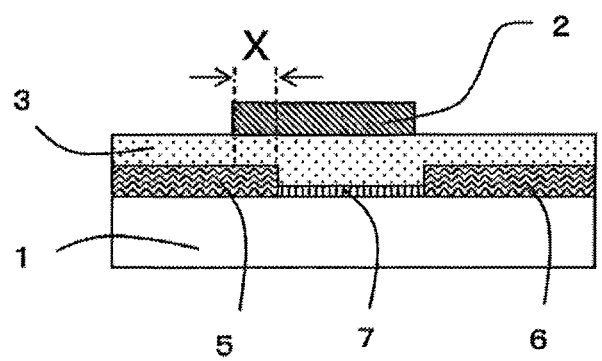
FIG. 8 is a cross-sectional view for explaining a method for evaluating a positional deviation between a gate electrode and a source/drain electrode.

[2] Positional Deviation Evaluation Between Gate Electrode and Source/Drain Electrode The evaluation will be described with reference to FIGS. 7 and 8. With respect to the FET formed, cross sections of random 20 elements were observed with the use of a scanning electron microscope (SEM), and the length X of an overlap between the gate electrode 2 and the source electrode 5 or the drain electrode 6 was measured for each element. The average value of X for the 20 elements was determined.

[3] Evaluation of Mobility of FET

The characteristics of source-drain current (Id)-source-drain voltage (Vsd) were measured when the gate voltage (Vg) of the FET was varied. The measurement was made under the atmosphere with the use of a semiconductor characterization system Model 4200-SCS (manufactured by Keithley Instruments Co., Ltd.). The mobility was determined from the change in Id value at Vsd=−5 V in the case of Vg=+20 V to −20 V.

[4] Evaluation of Hysteresis of FET

The characteristics of source-drain current (Id)-source-drain voltage (Vsd) were measured when the gate voltage (Vg) of the FET was varied, and hysteresis was determined from the absolute value $|Vg^1-Vg^2|$ of the difference between the gate voltage $Vg^1$ at $Id=10^{-8}$ A in the case of applying Vg from positive to negative, and the gate voltage $Vg^2$ at $Id=10^{-8}$ A in the case of applying Vg from the negative to the positive.

[5] Surface Roughness Measurement

The surface roughness of the source electrode and drain electrode was measured. For the measurement, a surface shape measurement apparatus (SURFCOM 1400 manufactured by Tokyo Seimitsu Co., Ltd.) was used to obtain a roughness curve on the surfaces of the source electrode and drain electrode. Only 1 mm of the obtained roughness curve was extracted in the scanning direction, and with the average line of the extracted part in the height direction as a reference, the sum of: the average for the heights from the highest peak to the fifth highest in descending order; and the average for the absolute values of the depths from the lowest valley to the fifth lowest valley in ascending order was regarded as ten point average roughness Rz.

Synthesis Example 1: Compound P1
(Photosensitive Organic Component)

Copolymerization Ratio (mass basis):ethyl acrylate (hereinafter, "EA")/2-ethylhexyl methacrylate (hereinafter, "2-EHMA")/styrene (hereinafter, "St")/glycidyl methacrylate (hereinafter, "GMA")/acrylic acid (hereinafter, "AA") =20/40/20/5/15.

In a reaction container in a nitrogen atmosphere, 150 g of diethylene glycol monoethyl ether acetate (hereinafter, "DMEA") was put, and the temperature was raised up to 80° C. with the use of an oil bath. Delivered by drops into the container over 1 hour was a mixture composed of 20 g of EA, 40 g of 2-EHMA, 20 g of St, 15 g of AA, 0.8 g of 2,2'-azobisisobutyronitrile, and 10 g of DMEA. After the completion of the dropping, the polymerization reaction was further developed for 6 hours. Thereafter, 1 g of hydroquinone monomethyl ether was added to terminate the polymerization reaction. Subsequently, a mixture composed of 5 g of GMA, 1 g of triethylbenzylammonium chloride, and 10 g of DMEA was delivered by drops over 0.5 hours. After the completion of the dropping, the addition reaction was further developed for 2 hours. The obtained reaction solution was purified with methanol to remove unreacted impurities, and further dried in vacuum for 24 hours to obtain a compound P1.

Synthesis Example 2: Compound P2
(Photosensitive Organic Component)

Copolymerization Ratio (mass basis):bifunctional epoxy acrylate monomer (epoxy ester 3002A; manufactured by Kyoeisha Chemical Co., Ltd.)/bifunctional epoxy acrylate monomer (epoxy ester 70 PA; manufactured by Kyoeisha Chemical Co., Ltd.)/GMA/St/AA=20/40/5/20/15.

In a reaction container in a nitrogen atmosphere, 150 g of diethylene glycol monoethyl ether acetate (hereinafter, "DMEA") was put, and the temperature was raised up to 80° C. with the use of an oil bath. Delivered by drops into the container over 1 hour was a mixture composed of 20 g of epoxy ester 3002A, 40 g of epoxy ester 70PA, 20 g of St, 15 g of AA, 0.8 g of 2,2'-azobisisobutyronitrile, and 10 g of DMEA. After the completion of the dropping, the polymerization reaction was further developed for 6 hours. Thereafter, 1 g of hydroquinone monomethyl ether was added to terminate the polymerization reaction. Subsequently, a mixture composed of 5 g of GMA, 1 g of triethylbenzylammonium chloride, and 10 g of DMEA was delivered by drops over 0.5 hours. After the completion of the dropping, the addition reaction was further developed for 2 hours. The obtained reaction solution was purified with methanol to remove unreacted impurities, and further dried in vacuum for 24 hours to obtain a compound P2.

Synthesis Example 3: Compound P3
(Photosensitive Organic Component)

Urethane-modified Compound of Compound P2

In a reaction container in a nitrogen atmosphere, 100 g of diethylene glycol monoethyl ether acetate (hereinafter, "DMEA") was put, and the temperature was raised up to 80° C. with the use of an oil bath. Delivered by drops into the container over 1 hour was a mixture composed of 10 g of the photosensitive component P2, 3.5 g of n-hexyl isocyanate, and 10 g of DMEA. After the completion of the dropping, the reaction was further developed for 3 hours. The obtained reaction solution was purified with methanol to remove unreacted impurities, and further dried in vacuum for 24 hours to obtain a compound P3 having an urethane bond.

Preparation Example 1: Photosensitive Paste A

In a 100 ml clean bottle, 16 g of the compound P1 obtained above, 4 g of the compound P3, 4 g of a photopolymerization initiator OXE-01 (manufactured by BASF Japan K.K.), 0.6 g of an acid generating agent SI-110 (manufactured by Sanshin Chemical Industry Co., Ltd.), and 10 g of γ-butyrolactone (manufactured by Mitsubishi Gas Chemical Company, Inc.) were put, and mixed with a rotation-revolution vacuum mixer "Awatori Rentaro" (registered trademark) (ARE-310; manufactured by Thinky Corporation) to obtain a 34.6 g photosensitive resin solution (solid content: 78.5% by mass). Mixed were 8.0 g of the obtained photosensitive resin solution and 42.0 g of Ag particles of 2 μm in average particle diameter, and the mixture was kneaded with the use of a triple roller "EXAKT M-50" (trade name, manufactured by EXAKT) to obtain a 50 g photosensitive paste A.

Preparation Example 2: Photosensitive Paste B

A photosensitive paste B was obtained in the same way as in Preparation Example 1 except for the use of Ag particles of 0.2 μm in average particle size.

Preparation Example 3 Photosensitive Paste C

A photosensitive paste C was obtained in the same way as in Preparation Example 2 except that 20 g of the compound P1 was used without using the compound P3.

Preparation Example 4: Photosensitive Paste D

A photosensitive paste D was obtained in the same way as in Preparation Example 2 except for the use of 40 g of γ-butyrolactone.

TABLE 1

| | Photosensitive paste | Photosensitive organic component | Photopolymerization initiator | Conductor (average particle size) | Acid generating agent | Solvent |
|---|---|---|---|---|---|---|
| Preparation Example 1 | A | P1, P3 | OXE-01 | Ag (2 μm) | SI-110 | γ-butyrolactone |
| Preparation Example 2 | B | P1, P3 | OXE-01 | Ag (0.2 μm) | SI-110 | γ-butyrolactone |
| Preparation Example 3 | C | P1 | OXE-01 | Ag (0.2 μm) | SI-110 | γ-butyrolactone |
| Preparation Example 4 | D | P1, P3 | OXE-01 | Ag (0.2 μm) | SI-110 | γ-butyrolactone |

Example 1

(1) Preparation of Semiconductor Solution

To a flask containing 5 ml of chloroform, 0.10 g of poly-3-hexylthiophene (manufactured by Aldrich, regio-regular, number average molecular weight (Mn): 13000, hereinafter referred to as P3HT) was added, and subjected to ultrasonic agitation in an ultrasonic washing machine (US-2 manufactured by Iuchi Seieido Ltd., output: 120 W) to obtain a chloroform solution of P3HT. Then, this solution was taken in a dropper, and delivered by 0.5 ml drops into a mixed solution of: 20 ml of methanol; and 10 ml of 0.1 N hydrochloric acid, for the achievement of reprecipitation.

The solidified P3HT was collected by filtration through a membrane filter (manufactured by PTFE: tetrafluoroethylene) of 0.1 μm in pore size, and rinsed well with methanol, and then, the solvent was removed by vacuum drying. Further dissolution and reprecipitation were carried out one more time to obtain a 90 mg reprecipitation P3HT.

Next, 1.5 mg of CNT 1 (manufactured by CNI, single-walled CNT, purity: 95%) and 1.5 mg of the P3HT were added into 15 ml of chloroform, and subjected to, while cooling with ice, ultrasonic agitation, at an output of 250 W for 30 minutes with the use of an ultrasonic homogenizer (VCX-500 manufactured by TOKYO RIKAKIKAI CO, LTD). When ultrasonic irradiation was carried out for 30 minutes, the irradiation was stopped, 1.5 mg of the P3HT was added, and ultrasonic irradiation was further carried out for 1 minute, thereby providing a CNT dispersion A (the CNT composite concentration with respect to the solvent: 0.1 g/l).

Next, a semiconductor solution for forming the semiconductor layer 7 was prepared. The CNT dispersion A was subjected to filtration with the use of a membrane filter (pore size: 10 μm, diameter: 25 mm, omnipore membrane manufactured by Millipore Corporation) to remove the CNT composite of 10 μm or more in length. To 5 ml of the obtained filtrate, 45 ml of dichlorobenzene was added to provide a semiconductor solution A (the CNT composite concentration with respect to the solvent: 0.01 g/l).

(2) Preparation of Gate Insulating Layer Material

In 203.36 g of propylene glycol monobutyl ether (boiling point: 170° C.), 61.29 g (0.45 mol) of methyltrimethoxysilane (hereinafter, referred to as MTMSi), 12.31 g (0.05 mol) of β-(3,4-epoxycyclohexyl) ethyltrimethoxysilane (hereinafter, referred to as β-EpETMSi), and 99.15 g (0.5 mol) of phenyltrimethoxysilane (hereinafter, referred to as PhTMSi) were dissolved, and 54.90 g of water and 0.864 g of phosphoric acid were added thereto with stirring. The obtained solution was heated at a bath temperature of 105° C. for 2 hours to raise the internal temperature up to 90° C., thereby distilling off a constituent mainly composed of methanol as a by-product. Then, the solution was heated at a bath temperature of 130° C. for 2.0 hours to raise the internal temperature up to 118° C., thereby distilling out a constituent mainly composed of water and propylene glycol monobutyl ether, and then cooled to room temperature to obtain a gate insulating layer material A with a solid content concentration of 26.0% by mass.

The obtained gate insulating layer material A was weighed for 50 g, mixed with 16.6 g of propylene glycol monobutyl ether (boiling point: 170° C., hereinafter referred to as PGMB), and stirred for 2 hours at room temperature to obtain a gate insulating layer material B (solid content concentration: 19.5 mass %).

(3) Preparation of FET

A FET was prepared as shown in FIG. 1. The photosensitive paste A was applied onto a PET substrate (film thickness: 50 μm) by screen printing, and pre-baked at 100° C. for 10 minutes in a drying oven. Thereafter, all-wavelength exposure was carried out at an exposure of 70 mJ/cm² (in wavelength of 365 nm) with the use of an exposure apparatus "PEM-8M" (trade name, manufactured by Union Optical Co., Ltd.), dip development was carried out with a 0.5% $Na_2CO_3$ solution for 30 seconds, and after rinsing with ultrapure water, curing was carried out for 30 minutes at 140° C. in a drying oven to prepare a gate electrode on the substrate.

Next, the gate insulating layer material B prepared by the method described in the foregoing (2) was applied by spin coating (800 rpm×20 seconds) onto the PET substrate with the gate electrode formed thereon, and subjected to a heat treatment at 120° C. for 5 minutes, and again, the gate insulating layer material B was applied by spin coating (800 rpm×20 seconds), and subjected to a heat treatment at 200° C. for 30 minutes under a nitrogen flow, thereby forming a gate insulating layer with a film thickness of 400 nm.

Next, the photosensitive paste A was applied onto the gate insulating layer by screen printing, and pre-baked at 100° C. for 10 minutes in a drying oven. Thereafter, all-wavelength exposure was carried out at an exposure of 70 mJ/cm² (in wavelength of 365 nm) from the substrate rear surface side with the use of an exposure apparatus "PEM-8M", dip development was carried out with a 0.5% $Na_2CO_3$ solution for 30 seconds, and after rinsing with ultrapure water, curing was carried out for 30 minutes at 140° C. in a drying oven to prepare a source electrode and a drain electrode on the gate insulating layer. In that regard, when the intensity $I_0$ of exposure light for exposure from the rear surface side of the substrate and the intensity I of light passing through the substrate and the gate electrode and gate insulating layer formed on the substrate surface were measured in the 365 nm band with the use of a spectrophotometer (U-4100, manufactured by HITACHI) to examine whether the relation of the formula (a) was satisfied, the result was $-LOG_{10}(I/I_0)=2.9$, which satisfies the relation. In addition, the ten point average roughness Rz of the source electrode and drain electrode was 1.2 μm.

Next, 400 pl of the semiconductor solution A prepared by the method described in the foregoing (1) was delivered by drops between the source electrode and the drain electrode with the use of an ink-jet apparatus (manufactured by Cluster Technology Co., Ltd.), and subjected to a heat treatment at 150° C. for 30 minutes under a nitrogen flow on a hot plate to form a semiconductor layer, thereby providing an FET. The spacing between the source electrode and the drain electrode was 20 μm.

The obtained FET was evaluated by the methods described in [1] to [3] for the adhesion, the positional deviation between the gate electrode and the source/drain electrode, and the mobility of the FET.

The result of evaluating the adhesion of the gate electrode, the source electrode, and the drain electrode was A, and the average value of the positional deviation X between the gate electrode and the source/drain electrode was 0.5 μm. The mobility was 0.6 cm²/V-sec, and the hysteresis was 19.1 V.

Example 2

(1) Preparation of FET

An FET was prepared in the same way as in Example 1 except that the use of the photosensitive paste B for the formation of the gate electrode and the use of the photosensitive paste B for the formation of the source electrode and the drain electrode. In that regard, the relation was $-LOG_{10}(I/I_0)=3.1$ between the intensity $I_0$ of exposure light for exposure from the rear surface side of the substrate and the intensity I of light passing through the substrate and the gate electrode and gate insulating layer formed on the substrate surface. In addition, the ten point average roughness Rz of the source electrode and drain electrode was 1.1 μm.

When the prepared FET was evaluated in the same way as in Example 1, the result of evaluating the adhesion of the gate electrode, the source electrode, and the drain electrode was A, and the average value of the positional deviation X between the gate electrode and the source/drain electrode was 0.2 µm. The mobility of the FET was 0.6 cm$^2$/V·sec, and the hysteresis was 18.3 V.

Example 3

(1) Preparation of Gate Insulating Layer Material

The gate insulating layer material A was weighed for 10 g, and mixed with 13 g of aluminum bis (ethyl acetoacetate) mono(2,4-pentanedionate) (trade name "Aluminum Chelate D", manufactured by Kawaken Fine Chemical Co., Ltd., hereinafter, referred to as Aluminum Chelate D) and 42 g of propylene glycol monoethyl ether acetate (boiling point: 146° C., manufactured by Aldrich Co., hereinafter, referred to as PGMEA), and stirred for 2 hours at room temperature to obtain a gate insulating layer material C (solid content concentration: 24% by weight). The content of the polysiloxane in the present solution was 20 parts by weight with respect to 100 parts by weight of Aluminum Chelate D. When the gate insulating layer material C was stored in the air at room temperature, the gate insulating layer material C was stable without any precipitate observed even after one month.

(2) Preparation of FET

An FET was prepared in the same way as in Example 2 except that the gate insulating layer material C was used instead of the gate insulating layer material B. In that regard, the relation was $-\text{LOG}_{10}(I/I_0)=2.8$ between the intensity $I_0$ of exposure light for exposure from the rear surface side of the substrate and the intensity I of light passing through the substrate and the gate electrode and gate insulating layer formed on the substrate surface. In addition, the ten point average roughness Rz of the source electrode and drain electrode was 1.1 µm.

When the prepared FET was evaluated in the same way as in Example 1, the result of evaluating the adhesion of the gate electrode, the source electrode, and the drain electrode was A, and the average value of the positional deviation X between the gate electrode and the source/drain electrode was 0.2 µm. The mobility of the FET was 0.8 cm$^2$/V·sec, and the hysteresis was 11.8 V.

Example 4

(1) Preparation of FET

An FET was prepared in the same way as in Example 4 except that the use of the photosensitive paste C for the formation of the gate electrode and the use of the photosensitive paste C for the formation of the source electrode and the drain electrode. In that regard, the relation was $-\text{LOG}_{10}(I/I_0)=2.3$ between the intensity $I_0$ of exposure light for exposure from the rear surface side of the substrate and the intensity I of light passing through the substrate and the gate electrode and gate insulating layer formed on the substrate surface. In addition, the ten point average roughness Rz of the source electrode and drain electrode was 1.3 µm.

When the prepared FET was evaluated in the same way as in Example 1, the result of evaluating the adhesion of the gate electrode, the source electrode, and the drain electrode was B, and the average value of the positional deviation X between the gate electrode and the source/drain electrode was 0.5 µm. The mobility of the FET was 0.7 cm$^2$/V·sec, and the hysteresis was 12.8 V.

Example 5

(1) Preparation of Gate Insulating Layer Material

In the same way as in Example 1 except that 34.1 g (0.25 mol) of MTMSi, 99.2 g (0.5 mol) of PhTMSi, and 30.1 g (0.25 mol) of dimethyldimethoxysilane (hereinafter, referred to as DMDMSi), a gate insulating layer material was synthesized to obtain a gate insulating layer material D with a solid content concentration of 26.5% by weight.

The obtained gate insulating layer material D was weighed for 50.0 g, mixed with 16.0 g of PGMB, and stirred for 2 hours at room temperature to obtain a gate insulating layer material E.

(2) Preparation of FET

An FET was prepared in the same way as in Example 2 except that the gate insulating layer material E was used instead of the gate insulating layer material B. In that regard, the relation was $-\text{LOG}_{10}(I/I_0)=3.1$ between the intensity $I_0$ of exposure light for exposure from the rear surface side of the substrate and the intensity I of light passing through the substrate and the gate electrode and gate insulating layer formed on the substrate surface. In addition, the ten point average roughness Rz of the source electrode and drain electrode was 1.1 µm.

When the prepared FET was evaluated in the same way as in Example 1, the result of evaluating the adhesion of the gate electrode, the source electrode, and the drain electrode was A, and the average value of the positional deviation X between the gate electrode and the source/drain electrode was 0.4 µm. The mobility of the FET was 0.3 cm$^2$/V·sec, and the hysteresis was 18.1 V.

Example 6

(1) Preparation of Gate Insulating Layer Material

Polyvinylphenol (manufactured by Aldrich, weight average molecular weight (Mw): 20000, hereinafter, referred to as PVP), polymelamine coformaldehyde (manufactured by Aldrich, number average molecular weight (Mn): 432, hereinafter, referred to as PMF), and PGMEA were mixed at PVP:PMF:PGMEA=10:5:100 in ratio by weight to provide a gate insulating layer material F.

(2) Preparation of FET

An FET was prepared in the same way as in Example 2 except that the gate insulating layer material F was used instead of the gate insulating layer material B. In that regard, the relation was $-\text{LOG}_{10}(I/I_0)=2.9$ between the intensity $I_0$ of exposure light for exposure from the rear surface side of the substrate and the intensity I of light passing through the substrate and the gate electrode and gate insulating layer formed on the substrate surface. In addition, the ten point average roughness Rz of the source electrode and drain electrode was 1.1 µm.

When the prepared FET was evaluated in the same way as in Example 1, the result of evaluating the adhesion of the gate electrode, the source electrode, and the drain electrode was A, and the average value of the positional deviation X between the gate electrode and the source/drain electrode was 0.4 µm. The mobility of the FET was 0.2 cm$^2$/V·sec, and the hysteresis was 21.9 V.

Example 7

(1) Preparation of Semiconductor Solution

Into 30 ml of water, 1.5 mg of CNT 1 and 1.5 mg of sodium dodecylsulfate (manufactured by Wako Pure Chemical Industries, Ltd.) were added, and subjected to ultrasonic agitation at an output of 250 W for 3 hours with the use of an ultrasonic homogenizer while cooling with ice, thereby providing a CNT composite dispersion B (CNT composite concentration with respect to the solvent: 0.05 g/l). The obtained CNT composite dispersion B was centrifuged at 21000 G for 30 minutes with the use of a centrifuge (CT15E manufactured by Hitachi Koki Co., Ltd.), and then, 80 vol % of the supernatant was taken out to obtain a semiconductor solution B.

(2) Preparation of FET

An FET was prepared in the same way as in Example 2 except that the semiconductor solution B was used instead of the semiconductor solution A. In that regard, the relation was $-\text{LOG}_{10}(I/I_0)=3.3$ between the intensity $I_0$ of exposure light for exposure from the rear surface side of the substrate and the intensity I of light passing through the substrate and the gate electrode and gate insulating layer formed on the substrate surface. In addition, the ten point average roughness Rz of the source electrode and drain electrode was 1.0 μm.

When the prepared FET was evaluated in the same way as in Example 1, the result of evaluating the adhesion of the gate electrode, the source electrode, and the drain electrode was A, and the average value of the positional deviation X between the gate electrode and the source/drain electrode was 0.1 μm. The mobility of the FET was 0.1 $cm^2/V \cdot sec$, and the hysteresis was 17.6 V.

Example 8

(1) Preparation of RFID

The photosensitive paste B was applied onto a PET substrate (film thickness: 50 μm) by screen printing, and pre-baked at 100° C. for 10 minutes in a drying oven. Thereafter, all-wavelength exposure was carried out at an exposure of 70 $mJ/cm^2$ (in wavelength of 365 nm) with the use of an exposure apparatus "PEM-8M" (trade name, manufactured by Union Optical Co., Ltd.), dip development was carried out with a 0.5% $Na_2CO_3$ solution for 30 seconds, and after rinsing with ultrapure water, curing was carried out for 30 minutes at 140° C. in a drying oven to prepare an antenna pattern and a connection wiring pattern, a gate electrode, and a wiring on the substrate. Thereafter, an FET was prepared in the same way as in Example 2, and an RFID was prepared. In that regard, the relation was $-\text{LOG}_{10}(I/I_0)=3.2$ between the intensity $I_0$ of exposure light for exposure from the rear surface side of the substrate and the intensity I of light passing through the substrate and the gate electrode and gate insulating layer formed on the substrate surface. In addition, the ten point average roughness Rz of the source electrode and drain electrode was 1.1 μm. It was confirmed that the obtained RFID has conduction on the circuit composed of the antenna and FET, and operates as an RFID.

When the prepared FET was evaluated in the same way as in Example 1, the result of evaluating the adhesion of the gate electrode, the source electrode, and the drain electrode was A, and the average value of the positional deviation X between the gate electrode and the source/drain electrode was 0.3 μm. The mobility of the FET was 0.8 $cm^2/V \cdot sec$, and the hysteresis was 10.9 V. In addition, when the antenna pattern was evaluated for adhesion by the method described in [1], the evaluation result was A.

Example 9

(1) Preparation of FET

A FET was prepared as shown in FIG. 2. The photosensitive paste B was applied onto a PET substrate (film thickness: 50 μm) by screen printing, and pre-baked at 100° C. for 10 minutes in a drying oven. Thereafter, all-wavelength exposure was carried out at an exposure of 70 $mJ/cm^2$ (in wavelength of 365 nm) with the use of an exposure apparatus "PEM-8M" (trade name, manufactured by Union Optical Co., Ltd.), dip development was carried out with a 0.5% $Na_2CO_3$ solution for 30 seconds, and after rinsing with ultrapure water, curing was carried out for 30 minutes at 140° C. in a drying oven to prepare a source electrode and a drain electrode on the substrate.

Next, 400 pl of the semiconductor solution A was delivered by drops between the source electrode and the drain electrode with the use of an ink-jet apparatus (manufactured by Cluster Technology Co., Ltd.), and subjected to a heat treatment at 150° C. for 30 minutes under a nitrogen flow on a hot plate to form a semiconductor layer.

Next, the gate insulating layer material C was applied by spin coating (800 rpm×20 seconds) onto the PET substrate with the source electrode, drain electrode, and semiconductor layer formed thereon, and subjected to a heat treatment at 120° C. for 5 minutes, and again, the gate insulating layer material C was applied by spin coating (800 rpm×20 seconds), and subjected to a heat treatment at 200° C. for 30 minutes under a nitrogen flow, thereby forming a gate insulating layer with a film thickness of 400 nm.

Next, the photosensitive paste B was applied onto the gate insulating layer by screen printing, and pre-baked at 100° C. for 10 minutes in a drying oven. Thereafter, all-wavelength exposure was carried out at an exposure of 70 $mJ/cm^2$ (in wavelength of 365 nm) from the substrate rear surface side with the use of an exposure apparatus "PEM-8M", dip development was carried out with a 0.5% $Na_2CO_3$ solution for 30 seconds, and after rinsing with ultrapure water, curing was carried out for 30 minutes at 140° C. in a drying oven to form a gate electrode on the gate insulating layer, thereby providing an FET. In that regard, the relation was $-\text{LOG}_{10}(I/I_0)=3.0$ between the intensity $I_0$ of exposure light for exposure from the rear surface side of the substrate and the intensity I of light passing through the substrate and the source/drain electrodes and gate insulating layer formed on the substrate surface. In addition, the ten point average roughness Rz of the source electrode and the drain electrode was 1.1 μm, and the spacing between the source electrode and the drain electrode was 20 μm.

The result of evaluating the adhesion of the gate electrode, the source electrode, and the drain electrode was A as for the adhesion evaluation. The average value of the positional deviation X between the gate electrode and the source/drain electrode was 0.2 μm. In addition, the mobility of the FET was 0.7 $cm^2/V$ sec, and the hysteresis was 10.1 V.

Example 10

(1) Preparation of FET

The photosensitive paste D was applied onto a PET substrate (film thickness: 50 μm) by screen printing, and pre-baked at 100° C. for 10 minutes in a drying oven. Thereafter, all-wavelength exposure was carried out at an exposure of 70 $mJ/cm^2$ (in wavelength of 365 nm) with the use of an exposure apparatus "PEM-8M" (trade name, manufactured by Union Optical Co., Ltd.), dip development was carried out with a 0.5% $Na_2CO_3$ solution for 30 seconds, and after rinsing with ultrapure water, curing was carried out for 30 minutes at 140° C. in a drying oven to prepare a gate electrode of 210 nm in film thickness on the substrate. In the same way as in Example 2 except for the foregoing, an FET was prepared. In that regard, the relation was $-\mathrm{LOG}_{10}(I/I_0)=1.7$ between the intensity $I_0$ of exposure light for exposure from the rear surface side of the substrate and the intensity I of light passing through the substrate and the gate electrode and gate insulating layer formed on the substrate surface. In addition, the ten point average roughness Rz of the source electrode and the drain electrode was 1.0 µm, and the spacing between the source electrode and the drain electrode was 16 µm.

The result of evaluating the adhesion of the gate electrode, the source electrode, and the drain electrode was A as for the adhesion evaluation. The average value of the positional deviation X between the gate electrode and the source/drain electrode was 1.9 µm. In addition, the mobility of the FET was 0.4 cm²/V·sec, and the hysteresis was 11.7 V.

Example 11

(1) Preparation of FET

An FET was prepared in the same way as in Example 2 except that the FET was formed on a PET substrate (film thickness: 342 µm). In that regard, the relation was $-\mathrm{LOG}_{10}(I/I_0)=3.2$ between the intensity $I_0$ of exposure light for exposure from the rear surface side of the substrate and the intensity I of light passing through the substrate and the gate electrode and gate insulating layer formed on the substrate surface. In addition, the ten point average roughness Rz of the source electrode and the drain electrode was 1.1 µm, and the spacing between the source electrode and the drain electrode was 18 µm.

The result of evaluating the adhesion of the gate electrode, the source electrode, and the drain electrode was A as for the adhesion evaluation. The average value of the positional deviation X between the gate electrode and the source/drain electrode was 1.5 µm. In addition, the mobility of the FET was 0.7 cm²/V·sec, and the hysteresis was 10.1 V.

Example 12

(1) Preparation of FET

An FET was prepared in the same way as in Example 2 except that the FET was formed on a PET substrate (film thickness: 188 µm). In that regard, the relation was $-\mathrm{LOG}_{10}(I/I_0)=3.1$ between the intensity $I_0$ of exposure light for exposure from the rear surface side of the substrate and the intensity I of light passing through the substrate and the gate electrode and gate insulating layer formed on the substrate surface. In addition, the ten point average roughness Rz of the source electrode and the drain electrode was 1.1 µm, and the spacing between the source electrode and the drain electrode was 19 µm.

The result of evaluating the adhesion of the gate electrode, the source electrode, and the drain electrode was A as for the adhesion evaluation. The average value of the positional deviation X between the gate electrode and the source/drain electrode was 0.9 µm. In addition, the mobility of the FET was 0.8 cm²/V·sec, and the hysteresis was 10.6 V.

Example 13

(1) Preparation of FET

An FET was prepared in the same way as in Example 2 except that the gate insulating layer material C was applied by spin coating (500 rpm×20 seconds) onto the PET substrate with the gate electrode formed thereon, and subjected to a heat treatment at 120° C. for 5 minutes, and again, the gate insulating layer material C was applied by spin coating (500 rpm×20 seconds), and subjected to a heat treatment at 200° C. for 30 minutes under a nitrogen flow, thereby forming a gate insulating layer with a film thickness of 1100 nm. In that regard, the relation was $-\mathrm{LOG}_{10}(I/I_0)=3.2$ between the intensity $I_0$ of exposure light for exposure from the rear surface side of the substrate and the intensity I of light passing through the substrate and the gate electrode and gate insulating layer formed on the substrate surface. In addition, the ten point average roughness Rz of the source electrode and the drain electrode was 1.0 µm, and the spacing between the source electrode and the drain electrode was 17 µm.

The result of evaluating the adhesion of the gate electrode, the source electrode, and the drain electrode was A as for the adhesion evaluation. The average value of the positional deviation X between the gate electrode and the source/drain electrode was 1.6 µm. In addition, the mobility of the FET was 0.7 cm²/V·sec, and the hysteresis was 10.2 V.

Example 14

(1) Preparation of FET

A FET was prepared as shown in FIG. 1. The photosensitive paste B was applied onto a PET substrate (film thickness: 50 µm) by screen printing, and pre-baked at 100° C. for 10 minutes in a drying oven. Thereafter, all-wavelength exposure was carried out at an exposure of 70 mJ/cm² (in wavelength of 365 nm) with the use of an exposure apparatus "PEM-8M" (trade name, manufactured by Union Optical Co., Ltd.), dip development was carried out with a 0.5% $Na_2CO_3$ solution for 30 seconds, and after rinsing with ultrapure water, curing was carried out for 30 minutes at 140° C. in a drying oven to prepare a gate electrode on the substrate.

Next, the gate insulating layer material B prepared by the method described in the foregoing (2) was applied by spin coating (800 rpm×20 seconds) onto the PET substrate with the gate electrode formed thereon, and subjected to a heat treatment at 120° C. for 5 minutes, and again, the gate insulating layer material B was applied by spin coating (800 rpm×20 seconds), and subjected to a heat treatment at 200° C. for 30 minutes under a nitrogen flow, thereby forming a gate insulating layer with a film thickness of 400 nm.

Next, the photosensitive paste B was applied onto the gate insulating layer by screen printing, and pre-baked at 100° C. for 10 minutes in a drying oven. Thereafter, all-wavelength exposure was carried out at an exposure of 70 mJ/cm² (in wavelength of 365 nm) from the substrate rear surface side with the use of an exposure apparatus "PEM-8M". Next, all-wavelength exposure was carried out at an exposure of 30 mJ/cm² (in wavelength of 365 nm) from the substrate surface side. Next, dip development was carried out with a 0.5% $Na_2CO_3$ solution for 30 seconds, and after rinsing with ultrapure water, curing was carried out for 30 minutes at 140° C. in a drying oven to prepare a source electrode and a drain electrode on the gate insulating layer. In that regard, the relation was $-\mathrm{LOG}_{10}(I/I_0)=3.1$ between the intensity $I_0$ of exposure light for exposure from the rear surface side of the substrate and the intensity I of light passing through the substrate and the gate electrode and gate insulating layer formed on the substrate surface. In addition, the ten point average roughness Rz of the source electrode and the drain electrode was 0.2 µm, and the spacing between the source electrode and the drain electrode was 20 µm.

Next, 400 pl of the semiconductor solution A prepared by the method described in the foregoing (1) was delivered by drops between the source electrode and the drain electrode with the use of an ink-jet apparatus (manufactured by Cluster Technology Co., Ltd.), and subjected to a heat treatment at 150° C. for 30 minutes under a nitrogen flow on a hot plate to form a semiconductor layer, thereby providing an FET. The spacing between the source electrode and the drain electrode was 20 µm.

The result of evaluating the adhesion of the gate electrode, the source electrode, and the drain electrode was A, and the average value of the positional deviation X between the gate electrode and the source/drain electrode was 0.5 µm. The mobility was 1.1 cm$^2$/V·sec, and the hysteresis was 10.1 V.

Example 15

(1) Preparation of Gate Insulating Layer Material

In 215.91 g of PGMEA, 13.12 g (0.05 mol) of 3-trimethoxysilylpropylsuccinic anhydride (hereinafter, referred to as SucSi), 93.73 g (0.40 mol) of 3-acryloxypropyltrimethoxysilane (hereinafter, referred to as AcrSi), and 109.06 g (0.55 mol) of PhTMSi were dissolved, and 54.90 g of water and 0.864 g of phosphoric acid were added thereto with stirring. The obtained solution was heated at a bath temperature of 105° C. for 2 hours to raise the internal temperature up to 90° C., thereby distilling off a constituent mainly composed of methanol as a by-product. Then, the solution was heated at a bath temperature of 130° C. for 2.0 hours to raise the internal temperature up to 118° C., thereby distilling out a constituent mainly composed of water and PGMEA, and then cooled to room temperature to obtain a gate insulating layer material G with a solid content concentration of 26.0% by weight. The obtained gate insulating layer material G was weighed for 10 g, mixed with 0.83 g of PGMEA, and stirred for 2 hours at room temperature to obtain a gate insulating layer material H (solid content concentration: 24% by weight).

(2) Preparation of FET

An FET was prepared in the same way as in Example 14 except that the gate insulating layer material H was used instead of the gate insulating layer material B. In that regard, the relation was $-\text{LOG}_{10}(I/I_0)=3.3$ between the intensity $I_0$ of exposure light for exposure from the rear surface side of the substrate and the intensity I of light passing through the substrate and the gate electrode and gate insulating layer formed on the substrate surface. In addition, the ten point average roughness Rz of the source electrode and the drain electrode was 0.3 µm, and the spacing between the source electrode and the drain electrode was 20 µm.

When the prepared FET was evaluated in the same way as in Example 1, the result of evaluating the adhesion of the gate electrode, the source electrode, and the drain electrode was A, and the average value of the positional deviation X between the gate electrode and the source/drain electrode was 0.3 µm. The mobility of the FET was 1.2 cm$^2$/V sec, and the hysteresis was 5.8 V.

Example 16

(1) Preparation of FET

An FET was prepared in the same way as in Example 14 except that a gate electrode was prepared on a PET substrate (film thickness: 50 µm) by vacuum deposition of Al with a thickness of 150 nm through a mask in accordance with a resistance heating method. In that regard, the relation was $-\text{LOG}_{10}(I/I_0)=3.6$ between the intensity $I_0$ of exposure light for exposure from the rear surface side of the substrate and the intensity I of light passing through the substrate and the gate electrode and gate insulating layer formed on the substrate surface. In addition, the ten point average roughness Rz of the source electrode and the drain electrode was 0.2 µm, and the spacing between the source electrode and the drain electrode was 20 µm.

When the prepared FET was evaluated in the same way as in Example 1, the adhesion evaluation of the gate electrode was B, the result of evaluating the adhesion of the source electrode and the drain electrode was A, and the average value of the positional deviation X between the gate electrode and the source/drain electrode was 0.4 µm. The mobility of the FET was 1.1 cm2/V·sec, and the hysteresis was 9.8 V.

Comparative Example 1

(1) Preparation of FET

A FET was prepared as shown in FIG. 1. On a glass substrate (film thickness: 0.7 mm), Al with a thickness of 150 nm was vapor-deposited through a mask by a resistance heating method to prepare a gate electrode on the substrate.

Next, the gate insulating layer material C was applied by spin coating (800 rpm×20 seconds) onto the substrate with the gate electrode formed thereon, and subjected to a heat treatment at 120° C. for 5 minutes, and again, the gate insulating layer material C was applied by spin coating (800 rpm×20 seconds), and subjected to a heat treatment at 200° C. for 30 minutes under a nitrogen flow, thereby forming a gate insulating layer with a film thickness of 400 nm.

Next, on the gate insulating layer, gold was vapor-deposited by a resistance heating method so as to have a thickness of 50 nm, and a photoresist (trade name "LC100-10 cP", manufactured by Rohm and Haas Co., Ltd.) was applied thereto by spin coating (1000 rpm×20 seconds), and dried by heating at 100° C. for 10 minutes.

The prepared photoresist film was subjected to pattern exposure through a mask with the use of a parallel light mask aligner (PLA-501F manufactured by Canon Inc.), thereafter, subjected to shower development for 70 seconds with the use of ELM-D (trade name, manufactured by Mitsubishi Gas Chemical Co., Ltd.) which was a 2.38% by mass tetramethylammonium hydroxide aqueous solution, through the use of an automatic development apparatus (AD-2000 manufactured by Takizawa Industry Co., Ltd.), and then washed with water for 30 seconds. Thereafter, the photoresist was etched for 5 minutes with the use of an etching solution AURUM-302 (trade name, manufactured by Kanto Chemical Co., Inc.), and then washed with water for 30 seconds. The resist was separated by immersion in AZ remover 100 (trade name, manufactured by AZ Electronic Materials Co., Ltd.) for 5 minutes, and a source electrode and a drain electrode were formed by washing with water for 30 seconds, and then drying by heating at 120° C. for 20 minutes. The spacing between the source electrode and the drain electrode was 20 µm.

Next, 400 pl of the semiconductor solution A was delivered by drops between the source electrode and the drain electrode with the use of an ink-jet apparatus (manufactured by Cluster Technology Co., Ltd.), and subjected to a heat treatment at 150° C. for 3.0 minutes under a nitrogen flow on a hot plate to form a semiconductor layer, thereby providing a FET.

When the prepared FET was evaluated in the same way as in Example 1, the result of evaluating the adhesion of the gate electrode, the source electrode, and the drain electrode was C, and the average value of the positional deviation X between the gate electrode and the source/drain electrode was 5.3 µm. In addition, the mobility of the FET was 0.04 cm²/V·sec, and the hysteresis was 11.9 V.

Comparative Example 2

(1) Preparation of FET

A FET was prepared as shown in FIG. 1. The photosensitive paste B was applied onto a PET substrate (film thickness: 50 µm) by screen printing, and pre-baked at 100° C. for 10 minutes in a drying oven. Thereafter, all-wavelength exposure was carried out at an exposure of 70 mJ/cm² (in wavelength of 365 nm) with the use of an exposure apparatus "PEM-8M" (trade name, manufactured by Union Optical Co., Ltd.), dip development was carried out with a 0.5% Na₂CO₃ solution for 30 seconds, and after rinsing with ultrapure water, curing was carried out for 30 minutes at 140° C. in a drying oven to prepare a gate electrode on the substrate.

Next, the gate insulating layer material C was applied by spin coating (800 rpm×20 seconds) onto the substrate with the gate electrode formed thereon, and subjected to a heat treatment at 120° C. for 5 minutes, and again, the gate insulating layer material C was applied by spin coating (800 rpm×20 seconds), and subjected to a heat treatment at 200° C. for 30 minutes under a nitrogen flow, thereby forming a gate insulating layer with a film thickness of 400 nm.

Next, 400 pl of the semiconductor solution A was delivered by drops onto the gate insulating layer with the use of an ink-jet apparatus (manufactured by Cluster Technology Co., Ltd.), and subjected to a heat treatment at 150° C. for 30 minutes under a nitrogen flow on a hot plate to form a semiconductor layer.

Next, the photosensitive paste B was applied onto the gate insulating layer by screen printing so as to cover the semiconductor layer, and pre-baked at 100° C. for 10 minutes in a drying oven. Thereafter, all-wavelength exposure was carried out at an exposure of 70 mJ/cm² (in wavelength of 365 nm) from the substrate rear surface side with the use of an exposure apparatus "PEM-8M", dip development was carried out with a 0.5% Na₂CO₃ solution for 30 seconds, and after rinsing with ultrapure water, curing was carried out for 30 minutes at 140° C. in a drying oven to prepare a source electrode and a drain electrode on the gate insulating layer, thereby providing an FET. In that regard, the relation was $-LOG_{10}(I/I_0)=3.1$ between the intensity $I_0$ of exposure light for exposure from the rear surface side of the substrate and the intensity I of light passing through the substrate and the gate electrode and gate insulating layer formed on the substrate surface. In addition, the ten point average roughness Rz of the source electrode and the drain electrode was 1.2 µm, and the spacing between the source electrode and the drain electrode was 20 µm.

It was possible to confirm development residues of the photosensitive paste B on the semiconductor layer. In addition, when the prepared FET was evaluated in the same way as in Example 1, the result of evaluating the adhesion of the gate electrode, the source electrode, and the drain electrode was A, and the average value of the positional deviation X between the gate electrode and the source/drain electrode was 0.3 µm. In addition, the mobility of the FET was 0.05 cm²/V·sec, and the hysteresis was 13.1 V.

TABLE 2-1

| | Configuration | Semiconductor solution | Gate insulating layer Material | Silane compound of general formula (1) | | | Silane compound of general formula (2) | Silane compound of general formula (3) |
|---|---|---|---|---|---|---|---|---|
| Example 1 | FIG. 1 | A | B | MTMSi | PhTMSi | — | β-EpETMSi | — |
| Example 2 | FIG. 1 | A | B | MTMSi | PhTMSi | — | β-EpETMSi | — |
| Example 3 | FIG. 1 | A | C | MTMSi | PhTMSi | — | β-EpETMSi | — |
| Example 4 | FIG. 1 | A | C | MTMSi | PhTMSi | — | β-EpETMSi | — |
| Example 5 | FIG. 1 | A | E | MTMSi | PhTMSi | DMDMSi | — | — |
| Example 6 | FIG. 1 | A | F | — | — | — | — | — |
| Example 7 | FIG. 1 | B | C | MTMSi | PhTMSi | — | β-EpETMSi | — |
| Example 8 | FIG. 1 | A | C | MTMSi | PhTMSi | — | β-EpETMSi | — |
| Example 9 | FIG. 2 | A | C | MTMSi | PhTMSi | — | β-EpETMSi | — |
| Example 10 | FIG. 1 | A | C | MTMSi | PhTMSi | — | β-EpETMSi | — |
| Example 11 | FIG. 1 | A | C | MTMSi | PhTMSi | — | β-EpETMSi | — |
| Example 12 | FIG. 1 | A | C | MTMSi | PhTMSi | — | β-EpETMSi | — |
| Example 13 | FIG. 1 | A | C | MTMSi | PhTMSi | — | β-EpETMSi | — |
| Example 14 | FIG. 1 | A | C | MTMSi | PhTMSi | — | β-EpETMSi | — |
| Example 15 | FIG. 1 | A | H | — | PhTMSi | — | — | SucSi |
| Example 16 | FIG. 1 | A | C | MTMSi | PhTMSi | — | β-EpETMSi | — |
| Comparative Example 1 | FIG. 1 | A | C | MTMSi | PhTMSi | — | β-EpETMSi | — |
| Comparative Example 2 | FIG. 1 | A | C | MTMSi | PhTMSi | — | β-EpETMSi | — |

TABLE 2-2

| | $-LOG_{10}$ (I/I₀) | Gate electrode | Source/drain electrodes | Antenna |
|---|---|---|---|---|
| Example 1 | 2.9 | Photosensitive paste A | Photosensitive paste A | — |
| Example 2 | 3.1 | Photosensitive paste B | Photosensitive paste B | — |
| Example 3 | 2.8 | Photosensitive paste B | Photosensitive paste B | — |
| Example 4 | 2.3 | Photosensitive paste C | Photosensitive paste C | — |
| Example 5 | 3.1 | Photosensitive paste B | Photosensitive paste B | — |
| Example 6 | 2.9 | Photosensitive paste B | Photosensitive paste B | — |
| Example 7 | 3.3 | Photosensitive paste B | Photosensitive paste B | — |

TABLE 2-2-continued

| | −LOG₁₀ (I/I₀) | Gate electrode | Source/drain electrodes | Antenna |
|---|---|---|---|---|
| Example 8 | 3.2 | Photosensitive paste B | Photosensitive paste B | Photosensitive paste B |
| Example 9 | 3.0 | Photosensitive paste B | Photosensitive paste B | — |
| Example 10 | 1.7 | Photosensitive paste D | Photosensitive paste B | — |
| Example 11 | 3.2 | Photosensitive paste B | Photosensitive paste B | — |
| Example 12 | 3.1 | Photosensitive paste B | Photosensitive paste B | — |
| Example 13 | 3.2 | Photosensitive paste B | Photosensitive paste B | — |
| Example 14 | 3.1 | Photosensitive paste B | Photosensitive paste B | — |
| Example 15 | 3.3 | Photosensitive paste B | Photosensitive paste B | — |
| Example 16 | 3.6 | Al | Photosensitive paste B | — |
| Comparative Example 1 | — | Al | Au | — |
| Comparative Example 2 | 3.1 | Photosensitive paste B | Photosensitive paste B | — |

TABLE 3

| | Adhesion | | | Ten point average roughness Rz of upper electrode | Distance between S/D electrodes | Average value of positional deviation (X) | Mobility [cm²/V · sec] | Hysteresis [V] | Remarks |
|---|---|---|---|---|---|---|---|---|---|
| | Gate electrode | Source/drain electrodes | Antenna | | | | | | |
| Example 1 | A | A | — | 1.2 μm | 20 μm | 0.5 μm | 0.6 | 19.1 | |
| Example 2 | A | A | — | 1.1 μm | 20 μm | 0.2 μm | 0.6 | 18.3 | |
| Example 3 | A | A | — | 1.1 μm | 20 μm | 0.2 μm | 0.8 | 11.8 | |
| Example 4 | B | B | — | 1.3 μm | 20 μm | 0.5 μm | 0.7 | 12.8 | |
| Example 5 | A | A | — | 1.1 μm | 20 μm | 0.4 μm | 0.3 | 18.1 | |
| Example 6 | A | A | — | 1.1 μm | 20 μm | 0.4 μm | 0.2 | 21.9 | |
| Example 7 | A | A | — | 1.0 μm | 20 μm | 0.1 μm | 0.1 | 17.6 | |
| Example 8 | A | A | A | 1.1 μm | 20 μm | 0.3 μm | 0.8 | 10.9 | |
| Example 9 | A | A | — | 1.1 μm | 20 μm | 0.2 μm | 0.7 | 10.1 | |
| Example 10 | A | A | — | 1.0 μm | 16 μm | 1.9 μm | 0.4 | 11.7 | |
| Example 11 | A | A | — | 1.1 μm | 18 μm | 1.5 μm | 0.7 | 10.1 | |
| Example 12 | A | A | — | 1.1 μm | 19 μm | 0.9 μm | 0.8 | 10.6 | |
| Example 13 | A | A | — | 1.0 μm | 17 μm | 1.6 μm | 0.7 | 10.2 | |
| Example 14 | A | A | — | 0.2 μm | 20 μm | 0.5 μm | 1.1 | 10.1 | |
| Example 15 | A | A | — | 0.3 μm | 20 μm | 0.3 μm | 1.2 | 5.8 | |
| Example 16 | B | A | — | 0.2 μm | 20 μm | 0.4 μm | 1.1 | 9.8 | |
| Comparative Example 1 | B | C | — | 0.1 μm | 20 μm | 5.3 μm | 0.04 | 11.9 | |
| Comparative Example 2 | A | A | — | 1.2 μm | 20 μm | 0.3 μm | 0.05 | 13.1 | After formation of semiconductor layer, formation of source/drain electrodes |

REFERENCE SIGNS LIST

1 Substrate
2 Gate electrode
3 Gate insulating layer
4 Conductive film
5 Source electrode
6 Drain electrode
7 Semiconductor layer
8 Wiring for gate electrode
9 Wiring for source electrode
10 Wiring for drain electrode
20 Metal cylinder
21 FET substrate
100 Substrate
101 Antenna pattern
102 Circuit
103 Connection wiring

The invention claimed is:

1. A method for manufacturing a field-effect transistor, the method comprising the steps of: forming a gate electrode on a surface of a substrate; forming a gate insulating layer on the gate electrode; forming a conductive film containing a conductor and a photosensitive organic component by a coating method on the gate insulating layer; exposing the conductive film from a rear surface side of the substrate with the gate electrode as a mask; developing the exposed conductive film to form a source electrode and a drain electrode; and forming a semiconductor layer by a coating method between the source electrode and the drain electrode, wherein in the step of exposing the conductive film from the rear surface side of the substrate, the exposure light has any wavelength of 436 nm, 405 nm, or 365 nm, and an intensity $I_0$ of the exposure light and an intensity I of light passing through the substrate, and the electrode and the gate insulating layer formed on the substrate surface satisfy the following formula (a):

$$-\text{LOG}_{10}(I/I_0) \geq 2 \qquad (a);$$

wherein the method further comprises a step of exposing the conductive film from a surface side of the substrate after the step of exposing the conductive film from the rear surface side of the substrate.

2. The method for manufacturing a field-effect transistor according to claim 1, wherein the gate electrode is formed by a coating method.

3. The method for manufacturing a field-effect transistor according to claim 1, wherein the semiconductor layer comprises a carbon nanotube.

4. The method for manufacturing a field-effect transistor according to claim 1, wherein the substrate is 200 μm or less in thickness.

5. The method for manufacturing a field-effect transistor according to claim 1, wherein the gate insulating layer is 1 μm or less in film thickness.

6. The method for manufacturing a field-effect transistor according to claim 1, wherein the photosensitive organic component comprises a compound having a urethane group.

7. The method for manufacturing a field-effect transistor according to claim 1, wherein the semiconductor layer comprises a carbon nanotube composite with a conjugated polymer attached to at least a part of a surface of the carbon nanotube.

8. The method for manufacturing a field-effect transistor according to claim 1, wherein the coating method for forming the semiconductor layer is any one selected from the group consisting of an ink-jet method, a dispenser method, and a spray method.

9. The method for manufacturing a field-effect transistor according to claim 1, wherein the gate insulating layer comprises at least a polysiloxane containing a silane compound represented by the general formula (1) as a polymerized component:

$$R^1{}_m Si(OR^2)_{4-m} \tag{1}$$

where $R^1$ represents a hydrogen atom, an alkyl group, a cycloalkyl group, a heterocyclic group, an aryl group, a heteroaryl group, or an alkenyl group, and in a case in which there is more than one $R^1$, each $R^1$ may be identical or different, $R^2$ represents an alkyl group or a cycloalkyl group, and in a case in which there is more than one $R^2$, each $R^2$ may be identical or different, and m represents an integer of 1 to 3.

10. The method for manufacturing a field-effect transistor according to claim 9, wherein the polysiloxane further comprises a silane compound represented by the general formula (3) as a polymerized component:

$$A^1 R^6{}_k Si(OR^7)_{2-k} \tag{3}$$

wherein in the general formula (3), $R^6$ represents a hydrogen atom, an alkyl group, a cycloalkyl group, a heterocyclic group, an aryl group, a heteroaryl group, or an alkenyl group, $R^7$ represents a hydrogen atom, an alkyl group, an acyl group, or an aryl group, k represents 0 or 1, $A^1$ represents an organic group containing at least two carboxyl groups, sulfo groups, thiol groups, phenolic hydroxyl groups, or derivatives thereof, subject to the proviso that in a case in which the derivative is a cyclic condensed structure from two of the carboxyl groups, the sulfo groups, the thiol groups, and the phenolic hydroxyl groups, $A^1$ represents an organic group having at least one of the cyclic condensed structures.

11. A method for manufacturing a wireless communication device, the method comprising the steps of: forming a field-effect transistor by the manufacturing method according to claim 1; and forming an antenna pattern on the surface of the substrate.

12. A method for manufacturing a field-effect transistor, the method comprising the steps of: forming a source electrode and a drain electrode on a surface of a substrate; forming a semiconductor layer by a coating method between the source electrode and the drain electrode; forming a gate insulating layer on the source electrode, the drain electrode, and the semiconductor layer; forming a conductive film containing a conductor and a photosensitive organic component by a coating method on the gate insulating layer; exposing the conductive film from a rear surface side of the substrate with the source electrode and the drain electrode as a mask; and developing the exposed conductive film to form a gate electrode.

13. The method for manufacturing a field-effect transistor according to claim 12, wherein the source electrode and the drain electrode are formed by a coating method.

14. The method for manufacturing a field-effect transistor according to claim 12, wherein the semiconductor layer comprises a carbon nanotube.

15. The method for manufacturing a field-effect transistor according to claim 12, wherein in the step of exposing the conductive film from the rear surface side of the substrate, the exposure light has any wavelength of 436 nm, 405 nm, or 365 nm, and an intensity $I_0$ of the exposure light and an intensity I of light passing through the substrate, and the electrode and the gate insulating layer formed on the substrate surface satisfy the following formula (a):

$$-\mathrm{LOG}_{10}(I/I_0) \geq 2 \tag{a}$$

16. The method for manufacturing a field-effect transistor according to claim 12, the method further comprising a step of exposing the conductive film from a surface side of the substrate after the step of exposing the conductive film from the rear surface side of the substrate.

17. A method for manufacturing a field-effect transistor, the method comprising the steps of:
 forming a gate electrode on a surface of a substrate;
 forming a gate insulating layer on the gate electrode;
 forming a conductive film containing a conductor and a photosensitive organic component by a coating method on the gate insulating layer;
 exposing the conductive film from a rear surface side of the substrate with the gate electrode as a mask;
 developing the exposed conductive film to form a source electrode and a drain electrode; and
 forming a semiconductor layer by a coating method between the source electrode and the drain electrode, wherein the semiconductor layer comprises a carbon nanotube composite with a conjugated polymer attached to at least a part of a surface of the carbon nanotube.

* * * * *